(12) United States Patent
Shamanna et al.

(10) Patent No.: US 11,380,705 B2
(45) Date of Patent: Jul. 5, 2022

(54) INTEGRATED ASSEMBLIES, AND METHODS OF FORMING INTEGRATED ASSEMBLIES

(71) Applicant: Micron Technology, Inc., Boise, ID (US)

(72) Inventors: Vinayak Shamanna, Boise, ID (US); Lifang Xu, Boise, ID (US); Aaron R. Wilson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 55 days.

(21) Appl. No.: 16/784,435

(22) Filed: Feb. 7, 2020

(65) Prior Publication Data
US 2021/0249433 A1 Aug. 12, 2021

(51) Int. Cl.
| | |
|---|---|
| H01L 27/11582 | (2017.01) |
| H01L 27/11556 | (2017.01) |
| H01L 23/528 | (2006.01) |
| H01L 23/522 | (2006.01) |
| H01L 23/532 | (2006.01) |
| H01L 27/11565 | (2017.01) |
| H01L 21/768 | (2006.01) |
| H01L 21/02 | (2006.01) |
| H01L 27/11519 | (2017.01) |

(52) U.S. Cl.
CPC .... *H01L 27/11582* (2013.01); *H01L 21/0217* (2013.01); *H01L 21/02164* (2013.01); *H01L 21/76802* (2013.01); *H01L 21/76877* (2013.01); *H01L 23/5221* (2013.01); *H01L 23/5283* (2013.01); *H01L 23/53257* (2013.01); *H01L 23/53295* (2013.01); *H01L 27/11519* (2013.01); *H01L 27/11556* (2013.01); *H01L 27/11565* (2013.01)

(58) Field of Classification Search
CPC ......... H01L 27/11582; H01L 27/11556; H01L 27/11565; H01L 27/11519
See application file for complete search history.

(56) References Cited

U.S. PATENT DOCUMENTS

| | | | |
|---|---|---|---|
| 10,985,252 B2 | 4/2021 | Haller | |
| 2019/0157293 A1* | 5/2019 | Jang | ...................... H01L 23/528 |
| 2020/0303398 A1* | 9/2020 | Otsu | .................. H01L 27/11529 |

* cited by examiner

*Primary Examiner* — Selim U Ahmed
*Assistant Examiner* — Evan G Clinton
(74) *Attorney, Agent, or Firm* — Wells St. John P.S.

(57) ABSTRACT

Some embodiments include an integrated assembly having a memory array region, a staircase region, and an intervening region between the staircase region and the memory array region. The intervening region includes first and second slabs of insulative material extending through a stack of alternating insulative and conductive levels. Bridging regions are adjacent to the slabs. First slits are along the bridging regions, and second slits extend through the slabs. First panels are within the first slits, and second panels are within the second slits. The second panels are compositionally different from the first panels. Some embodiments include methods of forming integrated assemblies.

14 Claims, 29 Drawing Sheets

INTEGRATED ASSEMBLIES, AND METHODS OF FORMING INTEGRATED ASSEMBLIES

TECHNICAL FIELD

Integrated assemblies (e.g., integrated memory), and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells (memory structures).

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

The memory arrays (memory devices) described above may be fabricated on semiconductor dies. FIGS. 5-8 illustrate regions of an example integrated assembly 600 associated with a conventional die comprising conventional memory devices. The top-down view of FIG. 5 shows that the integrated assembly 600 includes a staircase region (or stadium region) 602 between a pair of memory array regions 604 and 606 (also referred to as Array-1 and Array-2). Gaps are provided between the staircase region 602 and the memory array regions 604 and 606 to indicate that there may be additional components between the staircase region and the memory array regions.

Although the illustrated application has a single staircase region 602 shown to be laterally between the memory array regions 604 and 606, in other applications two or more staircase regions may be laterally outward of the memory array regions.

The memory array regions and staircase region are subdivided amongst memory device sub-blocks (also referred to herein as blocks, or as block regions) 608 and 610. The illustrated block regions 608 and 610 are shown to extend across both of the memory arrays and the intervening staircase region. In other applications, the memory arrays may be considered to comprise different block regions relative to one another.

Peripheral regions 612, 614 and 616 are along edges of the block regions 608 and 610. The peripheral region 612 is between the block regions 608 and 610; the peripheral region 614 is on an opposing side of the block region 608 from the peripheral region 612; and the peripheral region 616 is on an opposing side of the block region 610 from the peripheral region 612. The regions 612, 614 and 616 may be considered to comprise slits filled with insulative material 618.

Channel material pillars 620 (only some of which are labeled) are within the memory array regions 604 and 606, and pass through a stack of conductive levels (discussed below). The channel material pillars 620 are shown to be circular, but may comprise any suitable shapes.

FIG. 6 shows a cross-sectional side view within a region "6" of FIG. 5. The illustrated region includes a stack 622 of alternating conductive levels 624 and insulative levels 626.

The conductive levels 624 comprise conductive material 628, and the insulative levels 626 comprise insulative material 630.

The conductive material 628 may comprise any suitable composition(s); and in some embodiments may comprise metal-containing material (e.g. tungsten). In some applications, the conductive material 628 may comprise a tungsten core at least partially surrounded by a liner comprising metal nitride (e.g., titanium nitride). In some embodiments, dielectric-barrier material (e.g., aluminum oxide) may at least partially surround the metal nitride liners within the illustrated levels 624. Accordingly, some of the material within the levels 624 may be insulative in some embodiments.

The insulative material 630 may comprise any suitable composition(s); and in some applications may comprise, consist essentially of, or consist of silicon dioxide.

The channel material pillars 620 extend through the stack 622, and comprise channel material 632. The channel material 632 may, for example, comprise, consist essentially of, or consist of appropriately-doped silicon. The channel material pillars 620 are shown to be annular rings surrounding insulative material 634. Such configuration of the channel material pillars may be considered to correspond to a "hollow" channel configuration, with the dielectric material 634 being provided within the hollows of the channel material pillars. In other applications, the channel material may be configured as solid pillars, rather than being configured as the illustrated hollow pillars.

The channel material pillars 620 are spaced from the conductive levels 624 of the stack 622 by intervening regions 636. The regions 636 may comprise tunneling material, charge-storage material, charge-blocking material and dielectric-barrier material. The tunneling material (also referred to as gate dielectric material) may comprise one or more of silicon dioxide, aluminum oxide, hafnium oxide, zirconium oxide, etc. The charge-storage material may comprise charge-trapping material (e.g., one or more of silicon nitride, silicon oxynitride, conductive nanodots, etc.). The charge-blocking material may comprise one or more of silicon dioxide, silicon oxynitride, aluminum oxide, hafnium oxide, zirconium oxide, etc. The dielectric-barrier material may comprise one or more of aluminum oxide, hafnium oxide, zirconium oxide, etc.

Memory cells (e.g., NAND memory cells) 638 (only some of which are labeled) are along the channel material pillars 620. The memory cells 638 include regions of the conductive levels 624 (specifically, control gate regions), portions of the channel material 632, and portions of the tunneling material, charge-storage material, charge-blocking material and dielectric-barrier material within the intervening regions 636. The memory cells 638 are vertically stacked one atop another. In some embodiments, the assembly 600 may be considered to comprise a three-dimensional NAND configuration (three-dimensional memory device) analogous to the configuration described above with reference to FIG. 2.

The conductive levels 624 may be referred to as wordline/control gate levels, in that they include wordlines and control gates associated with the vertically-stacked memory cells 638 of NAND strings. The number of memory cell levels in individual strings may be determined by the number of conductive levels 624. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

One or more of the lower conductive levels 624 may be incorporated into source-side select gates (SGSs).

The stack 622 is shown to be supported over a source structure 640. Such source structure may be analogous to the source structures 216 discussed above.

The source structure 640 may be supported by a semiconductor base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

FIG. 7 shows details about a region "7" within the staircase region 602 of FIG. 5. The illustrated region of FIG. 7 includes the peripheral regions 612, 614 and 616 extending along the blocks 608 and 610. The stack 622 of FIG. 6 passes through the illustrated region of FIG. 7. However, oxide 642 is provided to breakup such stack. The oxide 642 may be considered to be configured as slabs 643 which extend through the stack 622 (FIG. 6).

Connection regions 646 are between the slabs of oxide 642. The connection regions may be utilized for forming electrical connections to the conductive levels 624 (FIG. 6). Each of the conductive levels may be referred to as a tier. The illustrated connection regions 646 may be utilized to form connections to sets of the tiers. For instance, in the illustrated application one of the connection regions is utilized for forming connections to tiers 1-9, another is utilized for forming connections to tiers 10-18, another is utilized for forming connections to tiers 19-27, etc. The number of tiers accessed within each of the connection regions 646 may be determined by the overall number of conductive levels 624 (FIG. 6) and the overall number of connection regions 646.

A portion of the construction of FIG. 7 between a first of the interconnect regions 646 (the illustrated interconnect region comprising Tiers 1-9) and the memory array (Array-1) may be referred to as an intervening region (crest region) 645.

One problem with the densely-stacked conductive levels 624 of the stack 622 (FIG. 6) is that such conductive levels may create stresses across an underlying semiconductor substrate (wafer, die, etc.). The oxide 642 within the crest region 645 may replace large portions of the stack 622 to alleviate such stresses.

The peripheral regions 612, 614 and 616 are labeled as "Bridge Regions" to indicate that the regions 612, 614 and 616 may provide paths for the conductive levels of stack 622 (FIG. 6) to extend around the oxide slabs 643 and thereby reach the connection regions 646.

FIG. 8 shows a cross-sectional side view along the line 8-8 of FIG. 7. The conductive levels 624 are shown to have staggered terminal regions 648 within the interconnect connection regions 626, with such staggered terminal regions having a "staircase" configuration. The staggered terminal regions of the conductive levels 624 enable connections to be made from such conductive levels to appropriate circuitry (e.g., wordline driver circuitry). The view of FIG. 8 shows three of the conductive levels 624 being accessed in each of the interconnect regions 626. Such is for illustrative purposes only. Any suitable number of the conductive levels 624 may be accessed in the interconnect regions 626.

The bridge regions of FIG. 7 may be considered to be within slits provided along edges of the blocks 608 and 610. Additional slits may be provided within central regions of such blocks. In some applications, the conductive levels 624 may be formed utilizing gate-replacement methodology. Specifically, the levels 624 of FIGS. 6 and 8 may initially comprise sacrificial material, and then such sacrificial material may be removed and replaced with the conductive material 628. The levels 624 may be accessed with the slits formed in the regions 612, 614 and 616; and with any additional slits provided within central regions of the illustrated blocks 608 and 610. A problem with conventional processing may be that stresses may be induced during the forming of such slits, the utilization of such slits during the removal of sacrificial material from levels 624 and replacement of such sacrificial material with conductive material, and/or during the subsequent filling of the slits with material 618. Such stresses which may undesirably cause the blocks to bend. The bending of the blocks may lead to structural defects, and may ultimately lead to device failure.

It would be desirable to develop methods which alleviate the undesirable stresses induced during conventional processing, and to develop new architectures fabricated with such methods.

DETAILED DESCRIPTION OF THE ILLUSTRATED EMBODIMENTS

Some embodiments include recognition that the die-bending problems described above in the Background section may result, at least in part, from stresses imposed during the filling of slits within the intervening regions (crest regions) described above (i.e., the intervening regions 645 between the memory array regions and the staircase regions). Some embodiments form and fill a first series of the slits while maintaining symmetry across the intervening regions, and subsequently form and fill a second series of the slits. Example embodiments are described with reference to FIGS. 9-17.

Figure 9:
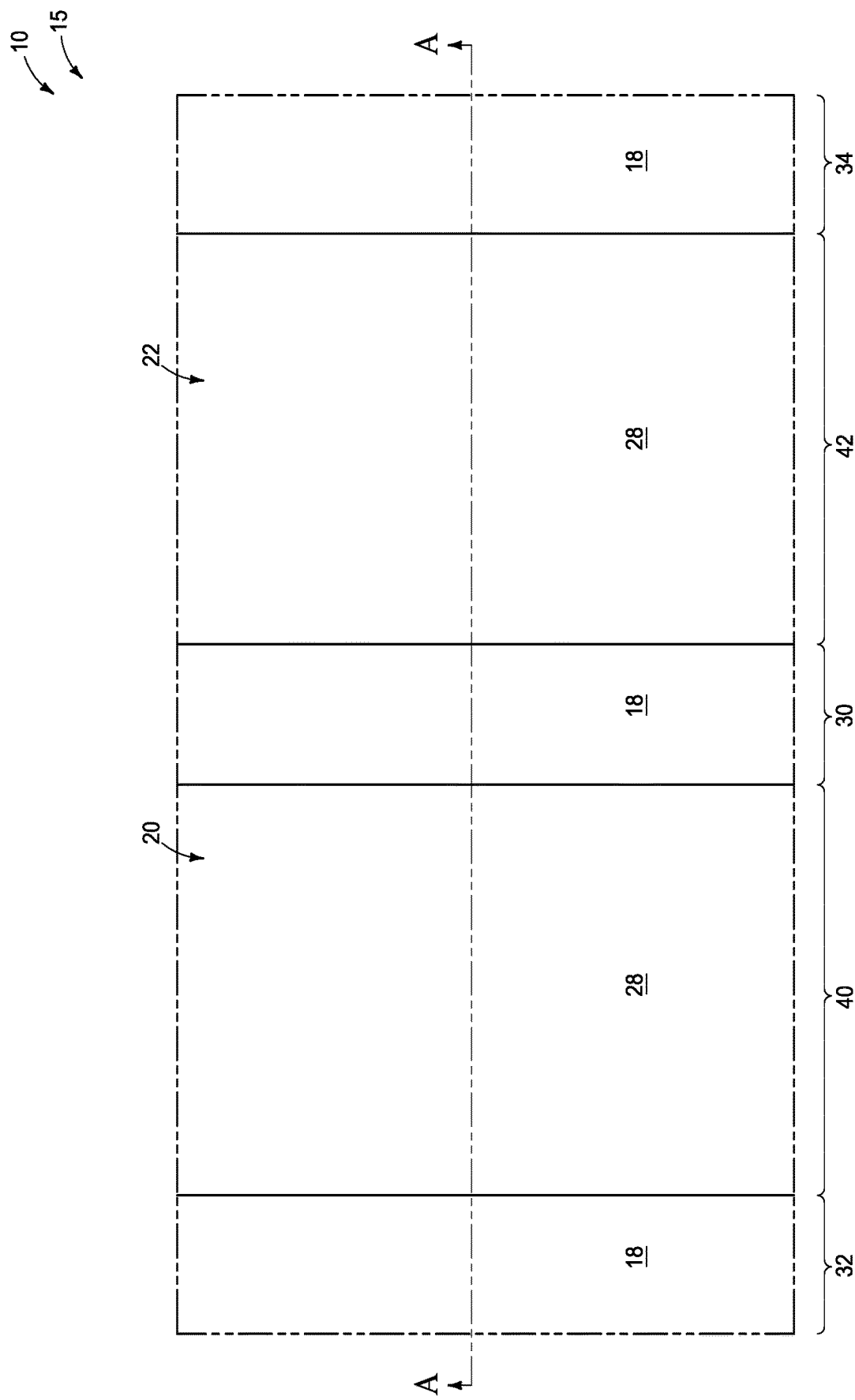
FIGS. 9, 9A and 9B are views of an assembly at an example process stage of an example method. The view of FIG. 9 is a diagrammatic top-down view. The view of FIG. 9A is a diagrammatic cross-sectional side view along the line A-A of FIG. 9. The view of FIG. 9B is a diagrammatic cross-sectional side view along a cross-section analogous to that of prior art FIG. 8.
Figure 9A:
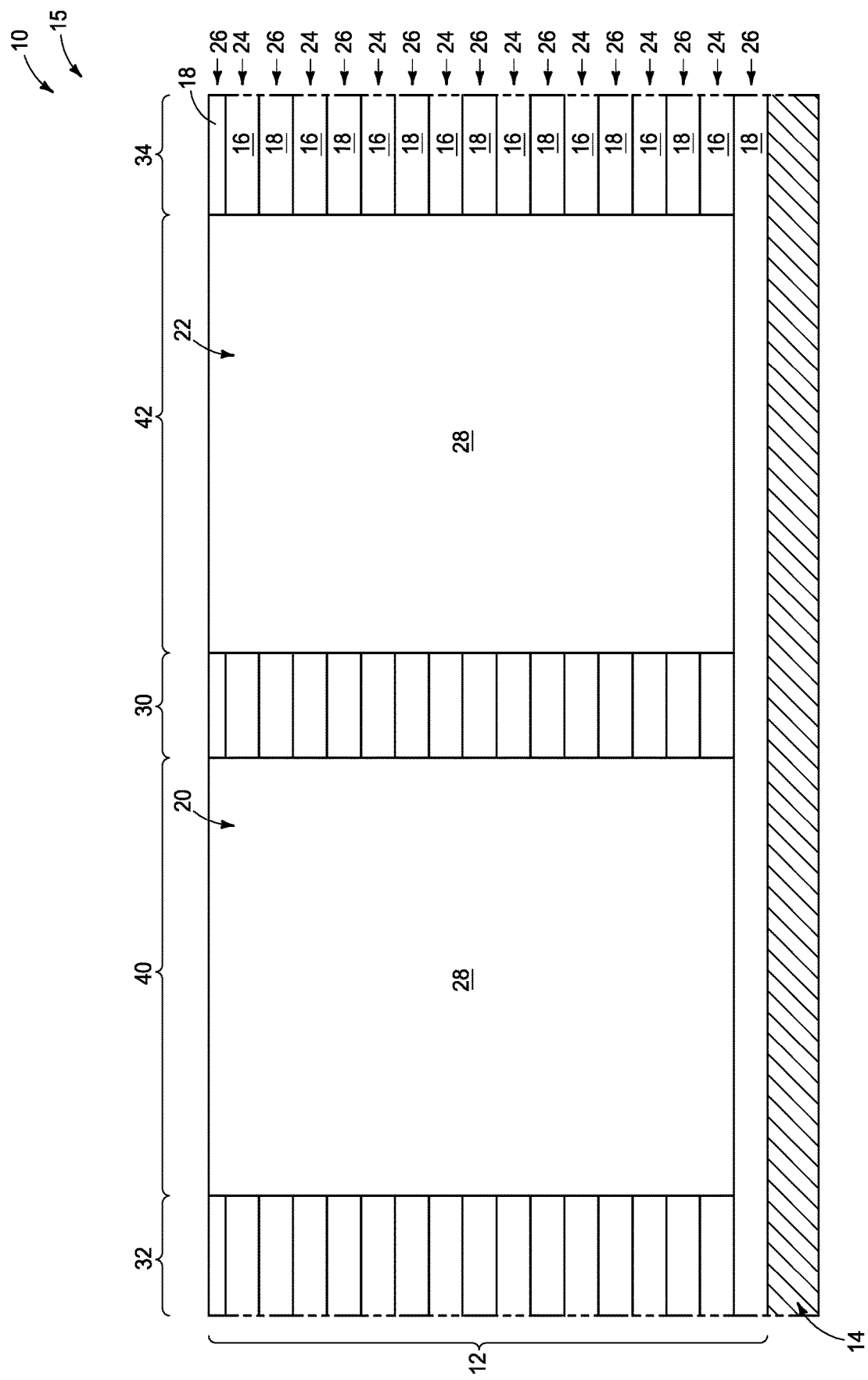

Referring to FIGS. 9 and 9A, an integrated assembly (construction, architecture, etc.) 10 includes a stack 12 supported over a source structure 14. The assembly 10 of FIGS. 9 and 9A may be within the region 602 described above with reference to FIG. 5; and specifically may correspond to an intervening (crest) region 15 analogous to the region 645 described above with reference to FIG. 7.

Figure 6:
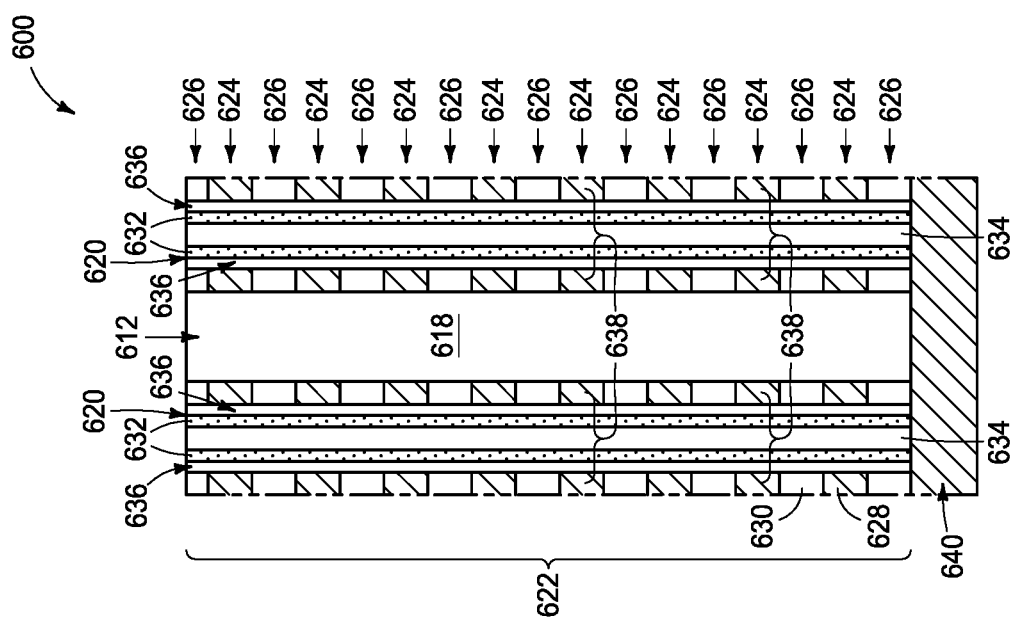
FIG. 6 is a diagrammatic cross-sectional side view along a region "6" of the prior art integrated assembly of FIG. 5.

The source structure 14 may be analogous to the source structure 640 described above with reference to FIG. 6.

The stack 12 includes alternating first and second levels (tiers) 24 and 26. The first levels 24 comprise sacrificial material 16, and the second levels 26 comprise insulative material 18.

The sacrificial material 16 may comprise any suitable composition(s); and in some embodiments may comprise, consist essentially of, or consist of silicon nitride.

The insulative material 18 may comprise any suitable composition(s); and in some embodiments may comprise, consist essentially of, or consist of silicon dioxide. The insulative material 18 may be referred to as a first insulative material to distinguish it from other insulative materials.

Insulative material 28 extends into the stack 12. The insulative material 28 is configured as a pair of slabs 20 and 22; which may be referred to as a first insulative slab and a second insulative slab, respectively.

The insulative material 28 may be referred to as a second insulative material to distinguish it from the first insulative material 18. The insulative material 28 may comprise any suitable composition(s); and in some embodiment may comprise, consist essentially of, or consist of silicon dioxide.

The slabs 20 and 22 may be analogous to the slabs 643 described above with reference to FIG. 7.

A first bridging region 30 is between the slabs 20 and 22; a second bridging region 32 is on an opposing sides of the first slab 20 from the first bridging region 30; and a third bridging region 34 is on an opposing side of the second slab 22 from the first bridging region 30. The first, second and third bridging regions may be considered to comprise first, second and third portions of the stack 12.

The bridging regions 30, 32 and 34 may be considered to be within peripheral regions analogous to the regions 612, 614 and 616 described above with reference to FIG. 7.

The region 15 of FIGS. 9 and 9A may be adjacent a memory array of the type described above with reference to FIGS. 5, 6 and 7. Such a memory array may comprise the stack 12 of FIG. 9A. In other words, the stack 622 of FIG. 6 may, at the process stage of FIGS. 9 and 9A, comprise the alternating levels 24 and 26, where the sacrificial material 16 is utilized in place of the conductive material 628, and where the insulative material 18 may be the same as the insulative material 630.

Figure 7:
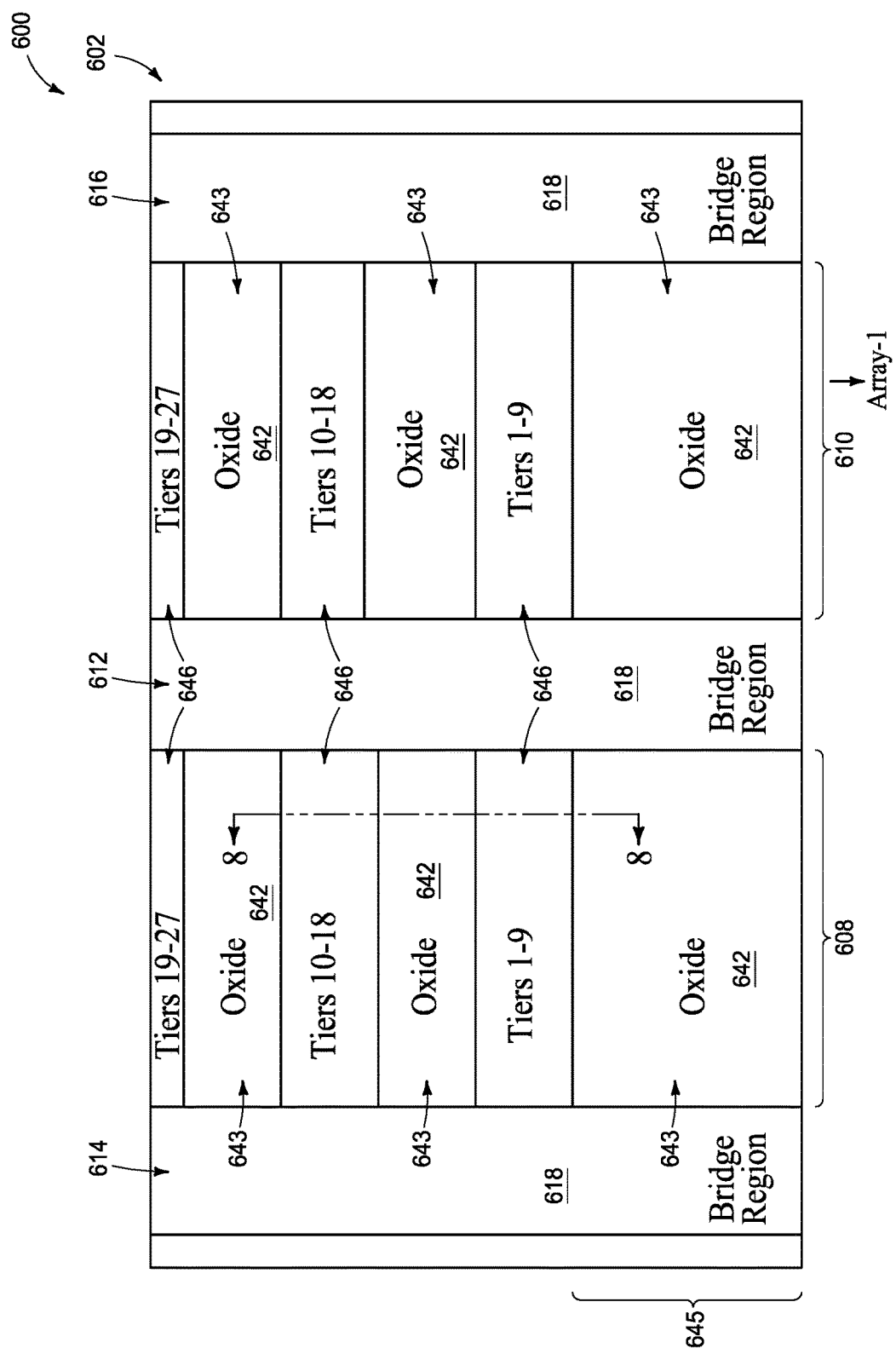
FIG. 7 is a diagrammatic top-down view along a region "7" of the prior art integrated assembly of FIG. 5.
Figure 8:
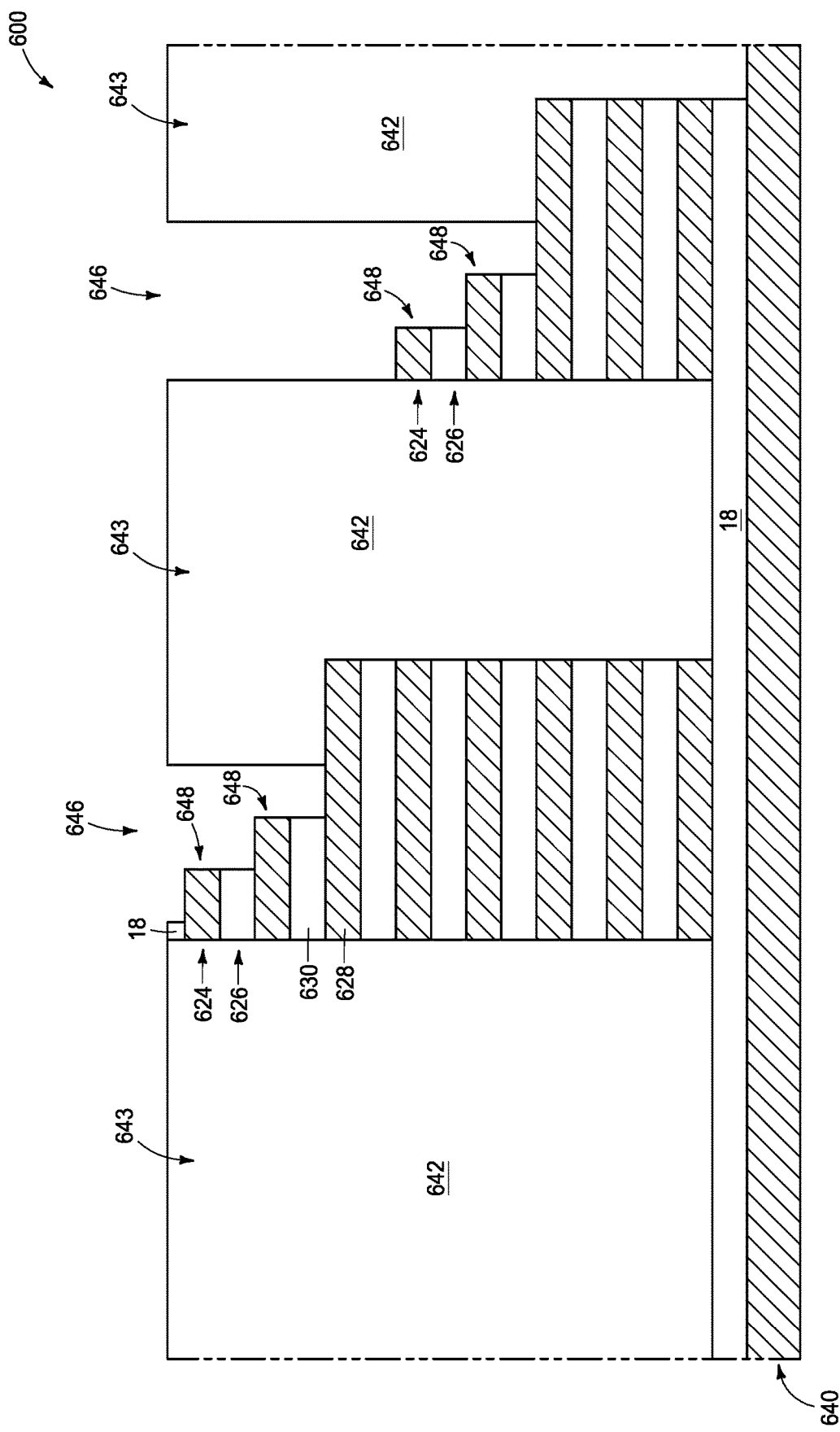
FIG. 8 is a diagrammatic cross-sectional side view along a line 8-8 of the prior art integrated assembly of FIG. 7.
Figure 9B:
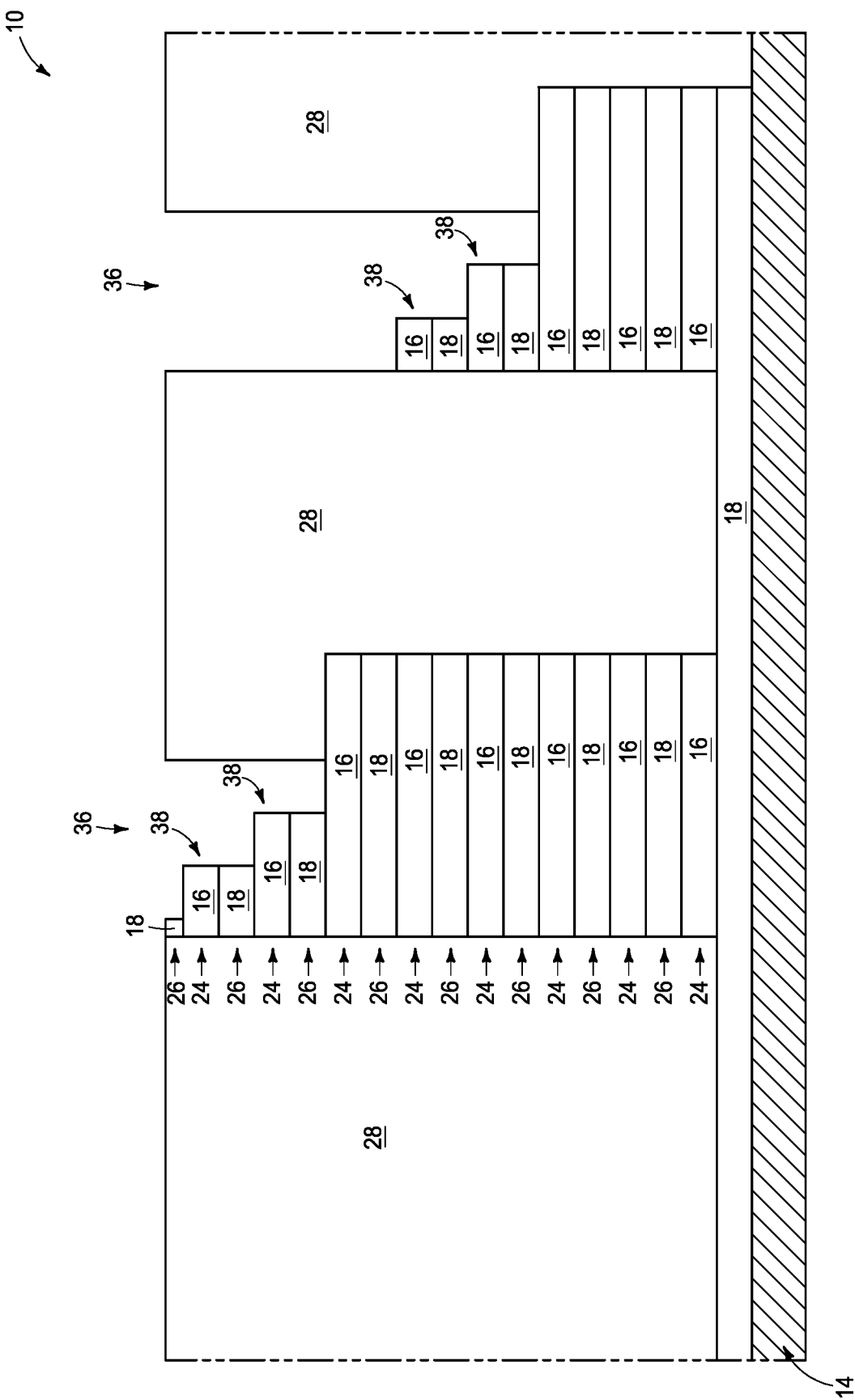

The region 15 of FIGS. 9 and 9A may also be proximate interconnect regions analogous to the regions 646 of FIGS. 7 and 8. For instance, FIG. 9B shows a region of the assembly 10 which may be proximate the region 15 of FIGS. 9 and 9A, and which is analogous to the region described above with reference to FIG. 8. The region of FIG. 9B comprises interconnect regions (staircase regions) 36 analogous to the regions 646 of FIG. 8. The alternating levels 24 and 26 are within the interconnect regions 36; with such levels comprising the sacrificial material 16 and the insulative material 18, respectively. The staircase regions 36 comprises staggered terminal ends 38 of the first levels 16.

The configuration of FIGS. 9 and 9A may be considered to comprise a pair block regions (blocks, sub-blocks) 40 and 42 analogous to the block regions 608 and 610 described above with reference to FIG. 5.

Figure 10:
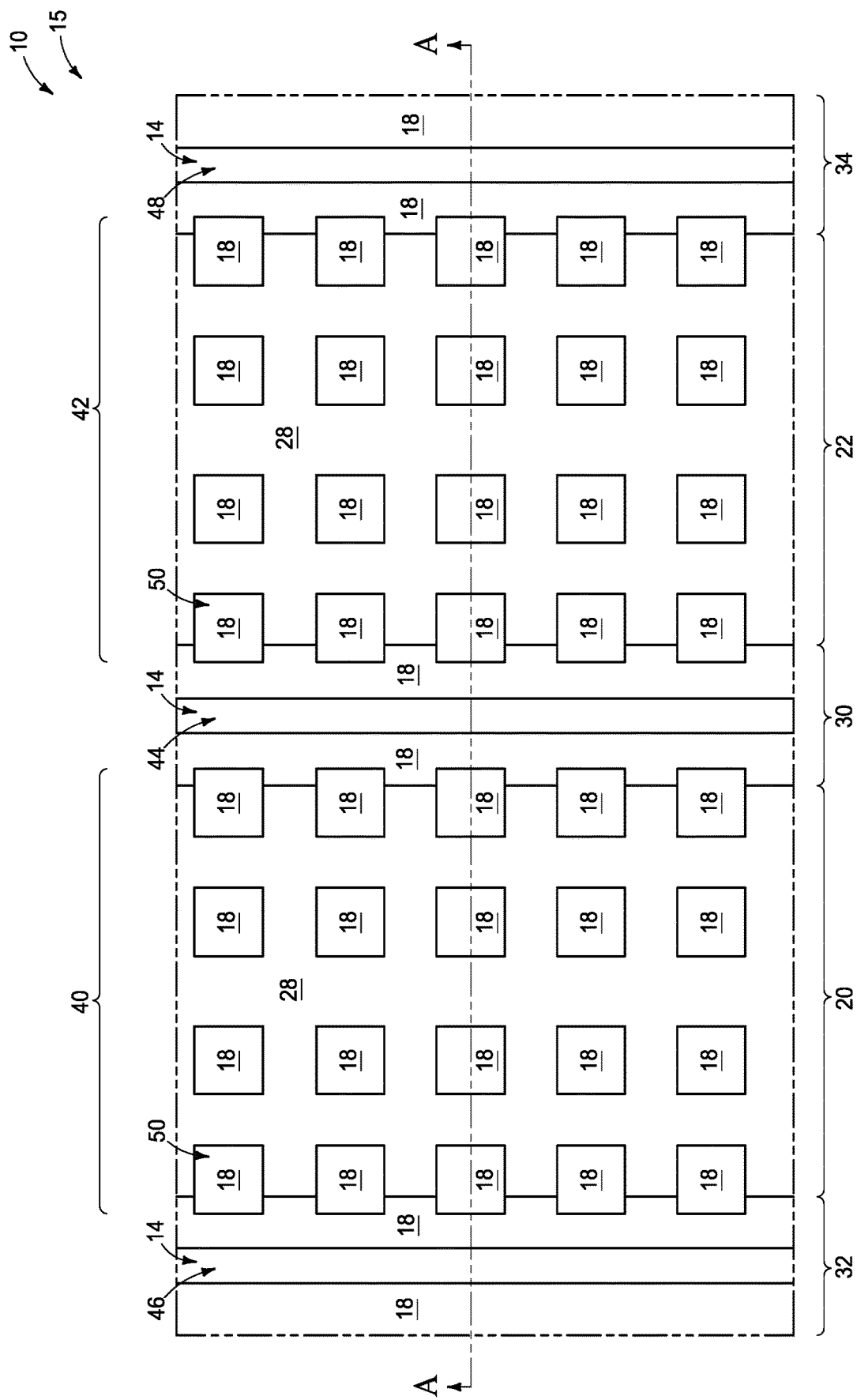
FIGS. 10 and 10A are views of the assembly of FIGS. 9, 9A and 9B at an example process stage following that of FIGS. 9, 9A and 9B. The view of FIG. 10 is a diagrammatic top-down view. The view of FIG. 10A is a diagrammatic cross-sectional side view along the line A-A of FIG. 10.
Figure 10A:
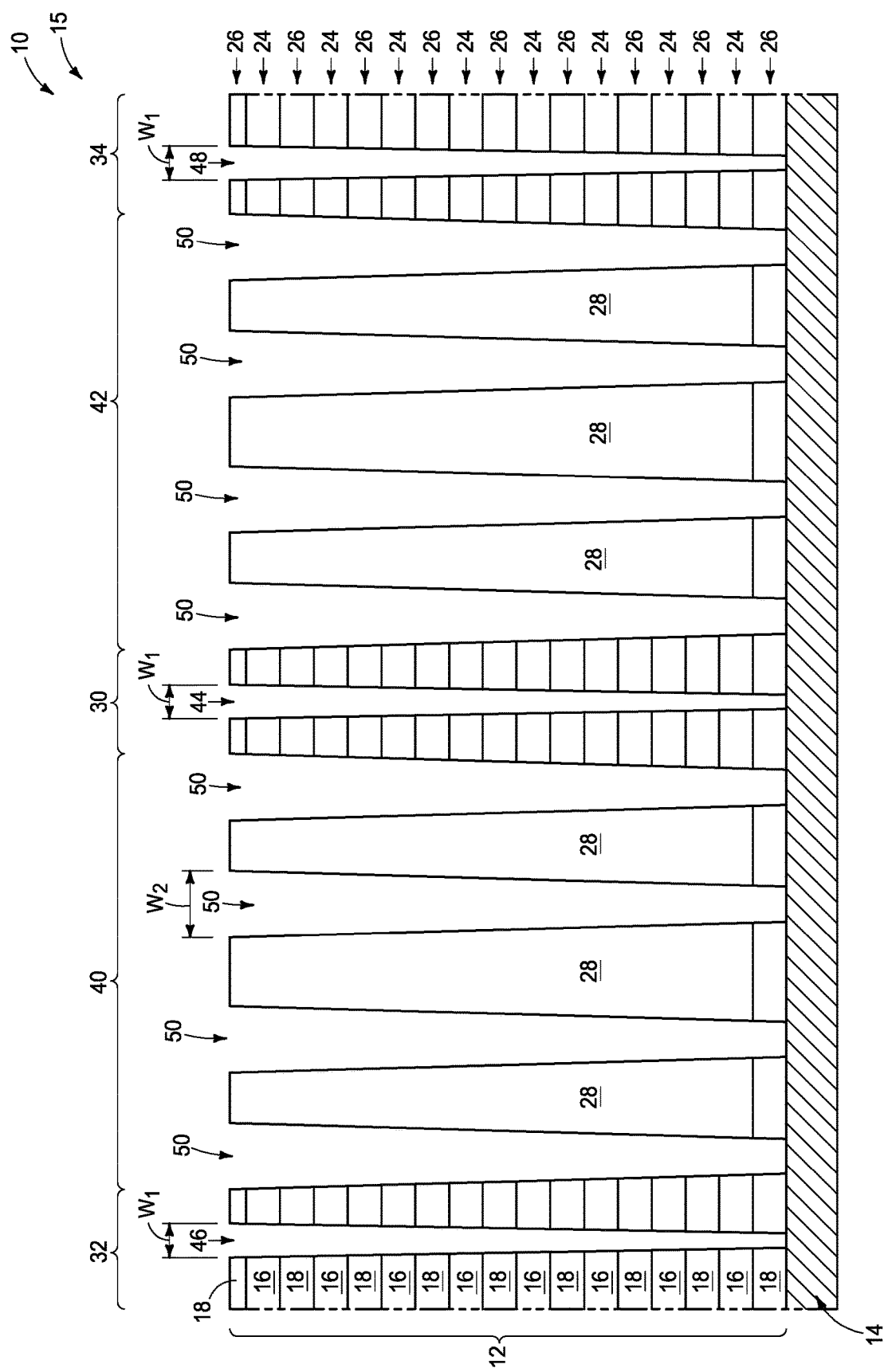

Referring to FIGS. 10 and 10A, a first slit 44 is formed within the first bridging portion 30 of the stack 12, a second slit 46 is formed within the second bridging portion 32 of the stack 12, and a third slit 48 is formed within the third bridging portion 30 of the stack 12. Also, openings 50 are formed to extend through the slabs 20 and 22. The openings 50 may be referred to as first openings to distinguish them from other openings formed at subsequent process stages. The openings 50 are shown to be square along the top-down view of FIG. 10. In other embodiments the openings may have other suitable shapes.

The slits 44, 46 and 48 have first widths $W_1$ along the cross-section of FIG. 10A, and the openings 50 have second widths $W_2$ along such cross-section, with the second widths being larger than the first widths. In some applications it may be advantageous for the slits to be narrower than the openings so that less conductive material is formed within the slits at a subsequent process stage. Generally, the first widths $W_1$ may be within a range of from about 10% to about 100% of the second widths $W_2$.

A problem which may be associated with conventional (prior art) methodology is that there can be asymmetric processing relative to the block regions 40 and 42, which can cause stresses along such regions leading to problematic block-bending. Notably, the process stage of FIGS. 10 and 10A has symmetry across the regions 40 and 42; and specifically has mirror symmetry of the indicated regions 30, 32, 34, 40 and 42 across the middle of the slit 44.

Figure 11:
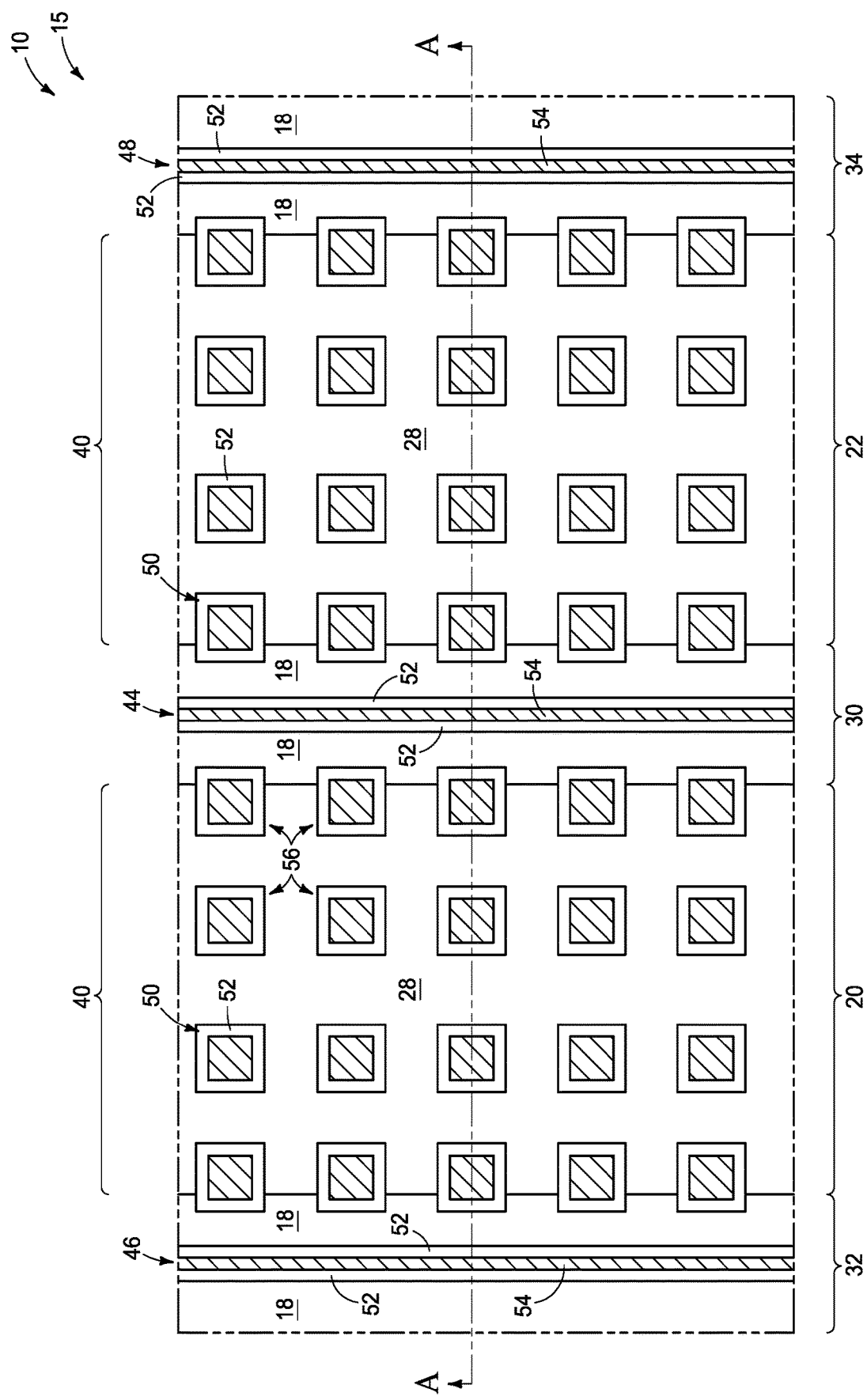
FIGS. 11 and 11A are views of the assembly of FIGS. 9, 9A and 9B at an example process stage following that of FIGS. 10 and 10A. The view of FIG. 11 is a diagrammatic top-down view. The view of FIG. 11A is a diagrammatic cross-sectional side view along the line A-A of FIG. 11.
Figure 11A:
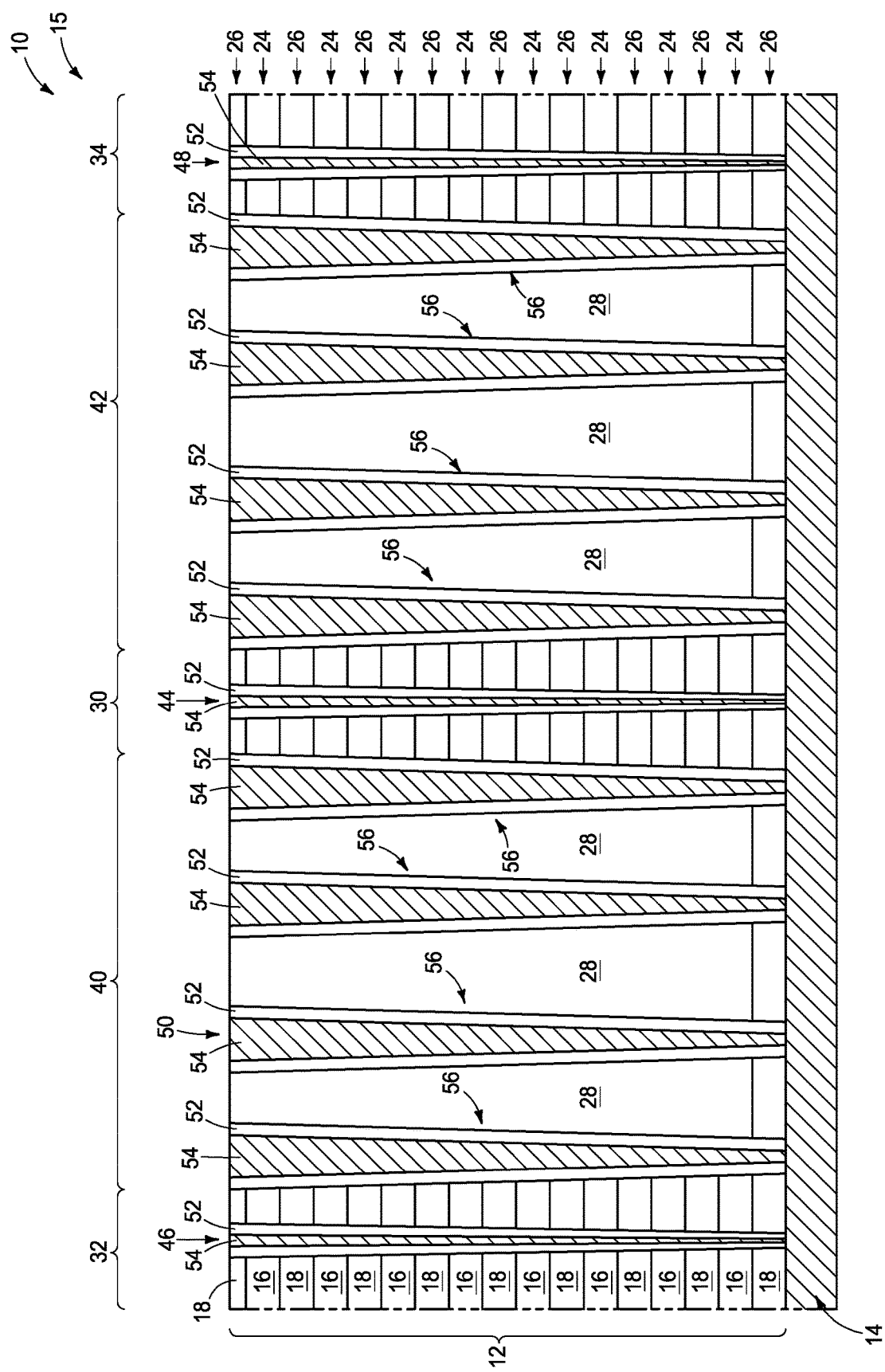

Referring to FIGS. 11 and 11A, the openings 50 and the slits 44, 48 and 46 are lined with liner material 52. The liner material 52 may comprise any suitable composition(s). In some embodiments the liner material 52 may be electrically insulative and may comprise, consist essentially of, or consist of one or more of silicon dioxide, high-k dielectric material, carbon, etc.; with the term "high-k" meaning a dielectric constant greater than that of silicon dioxide (i.e., greater than about 3.9). The liner material 52 may include semiconductive compositions and/or electrically conductive compositions in some embodiments. If the liner material comprises an electrically conductive composition, such may be present in a laminate so that outer edges of the liners within the slits and openings comprise insulative material while inner portions of the liners comprise the conductive composition. Suitable conductive compositions may include, for example, metal nitride, metal carbide, metal silicide, etc.

A material 54 is formed within the lined slits (44, 46 and 48) and the lined openings 50. The material 54 may be insulative, semiconductive or conductive. In some embodiments, the material 54 may be a metal-containing conductive material; and may, for example, comprise, consist essentially of, or consist of tungsten.

The materials 52 and 54 together form support structures (pillars) 56 within the openings 50. Some of the support structures may also be utilized as electrical interconnects. Others of the support structures may be "dummy" structures in that they comprise conductive material 54 but are not utilized as electrical interconnects.

Although the material 54 is shown formed within the slits 44, 46 and 48, in other embodiments the material 52 may entirely fill such slits so that material 54 is not formed within the slits.

Notably, the blocks 40 and 42 remain symmetric at the processing stage of FIGS. 11 and 11A.

Figure 12:
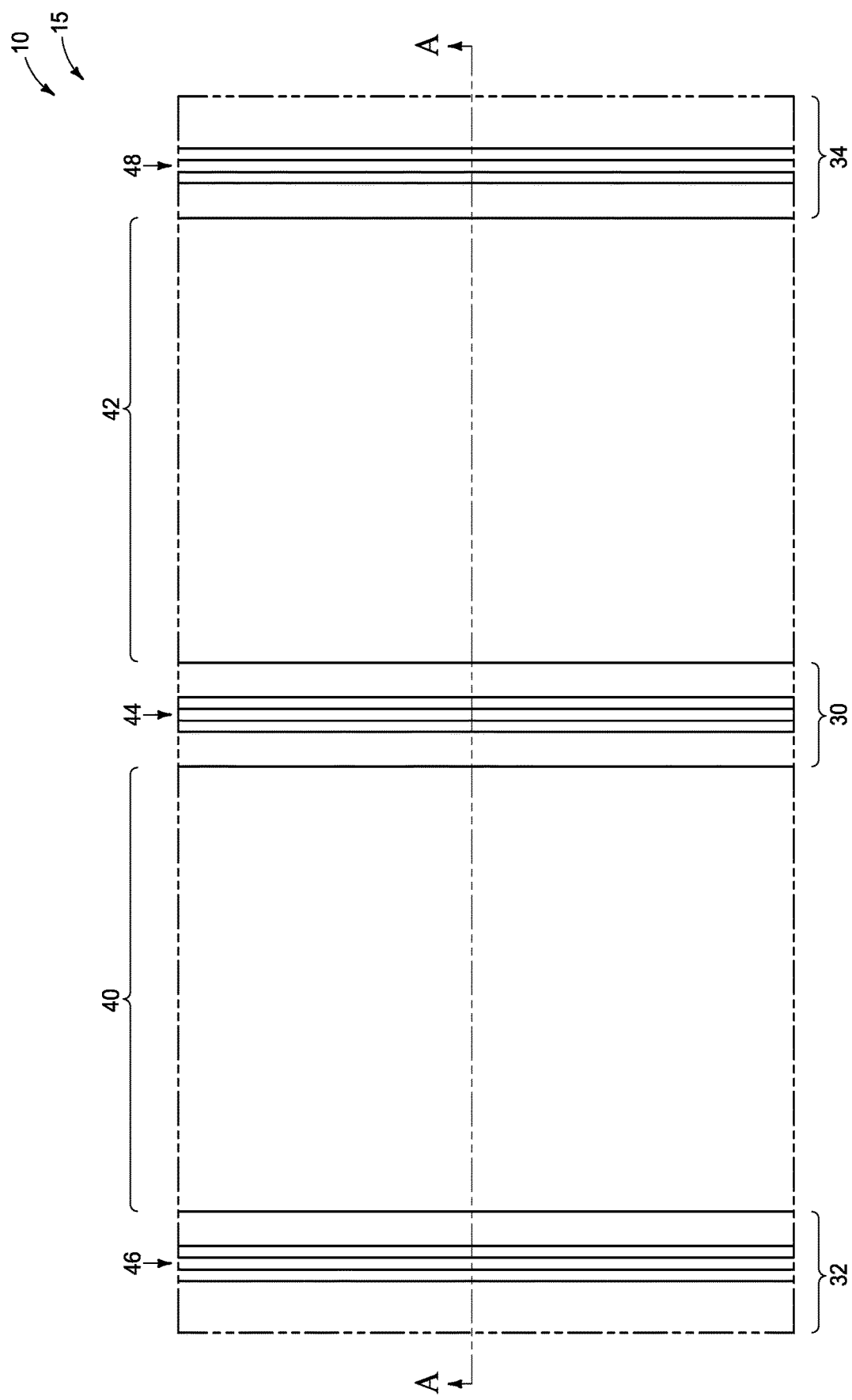
FIGS. 12 and 12A are views of the assembly of FIGS. 9, 9A and 9B at an example process stage following that of FIGS. 11 and 11A. The view of FIG. 12 is a diagrammatic top-down view. The view of FIG. 12A is a diagrammatic cross-sectional side view along the line A-A of FIG. 12.
Figure 12A:
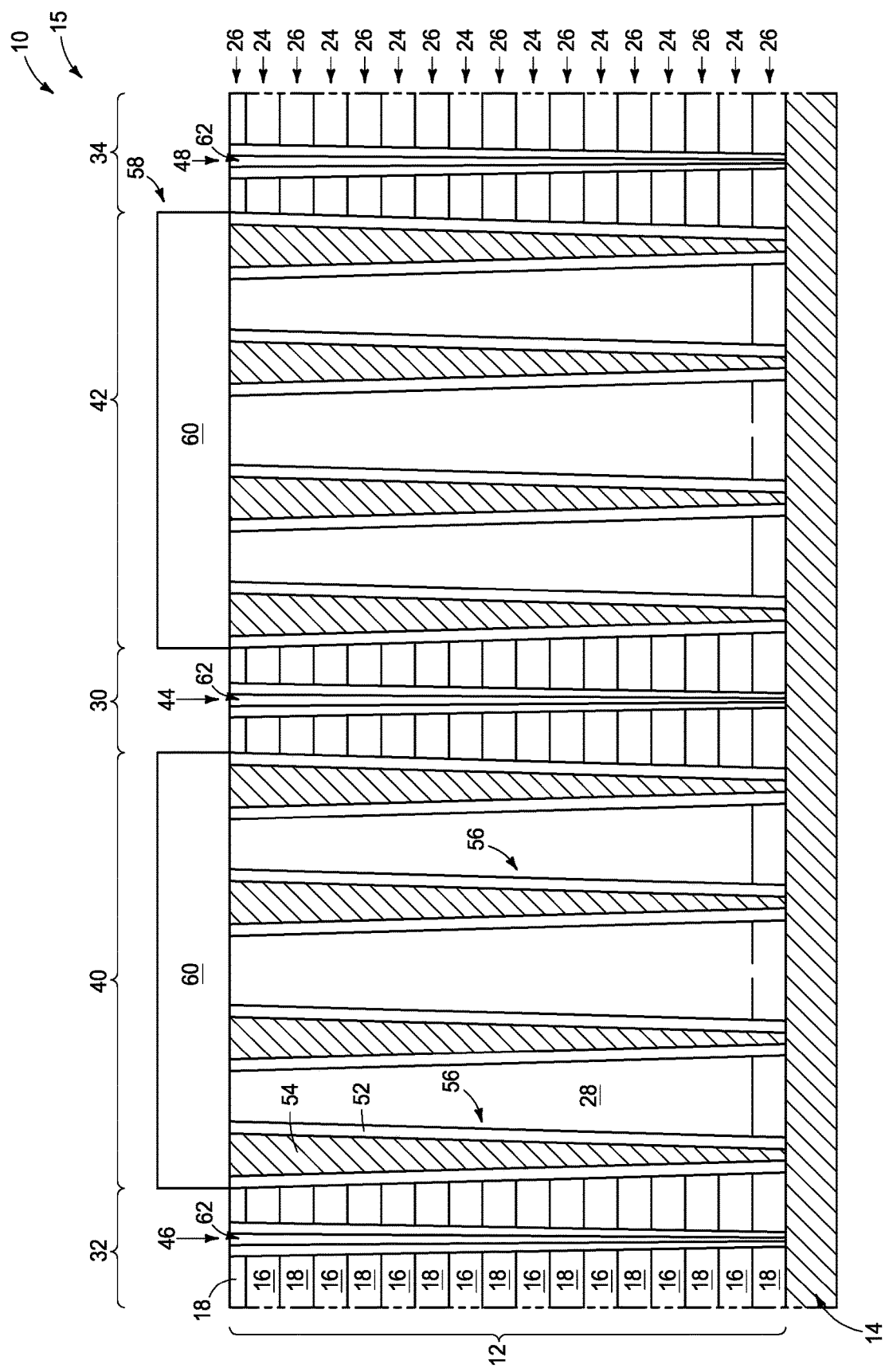

Referring to FIGS. 12 and 12A, a protective mask 58 is formed across the block regions 40 and 42, and then the material 54 is removed from within the slits 44, 46 and 48. The mask 58 comprises masking material 60. Such masking material may comprise any suitable composition(s); and in some embodiments may comprise photolithographically-patterned photoresist.

The slits 44, 46 and 48 remain lined with the liner material 42 at the processing stage of FIGS. 12 and 12A, and may be considered to be narrowed slits. The openings within such narrowed slits may be referred to as trenches 62.

Notably, the blocks 40 and 42 are symmetric at the processing stage of FIGS. 12 and 12A.

Figure 13:
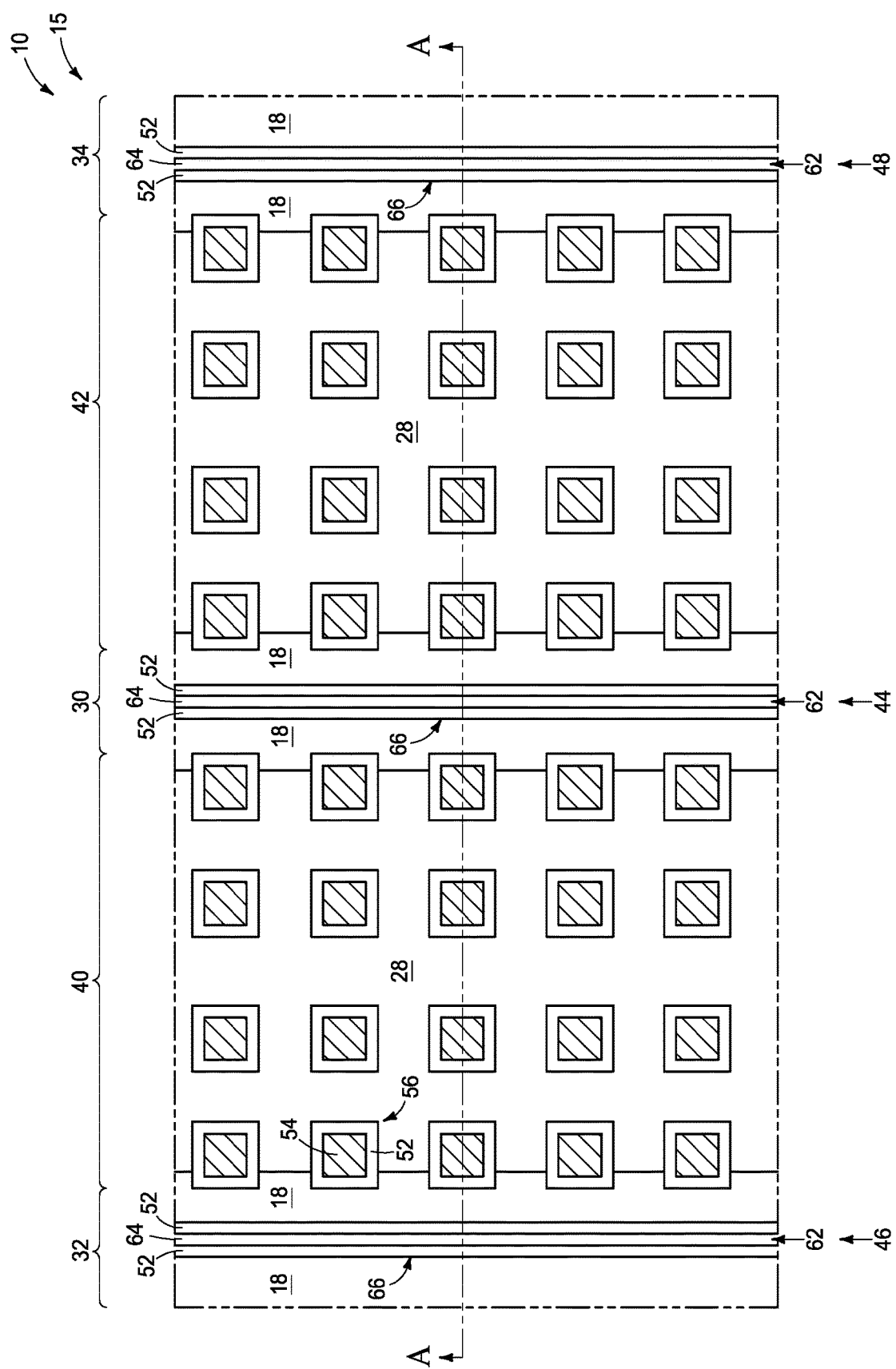
FIGS. 13 and 13A are views of the assembly of FIGS. 9, 9A and 9B at an example process stage following that of FIGS. 12 and 12A. The view of FIG. 13 is a diagrammatic top-down view. The view of FIG. 13A is a diagrammatic cross-sectional side view along the line A-A of FIG. 13.
Figure 13A:
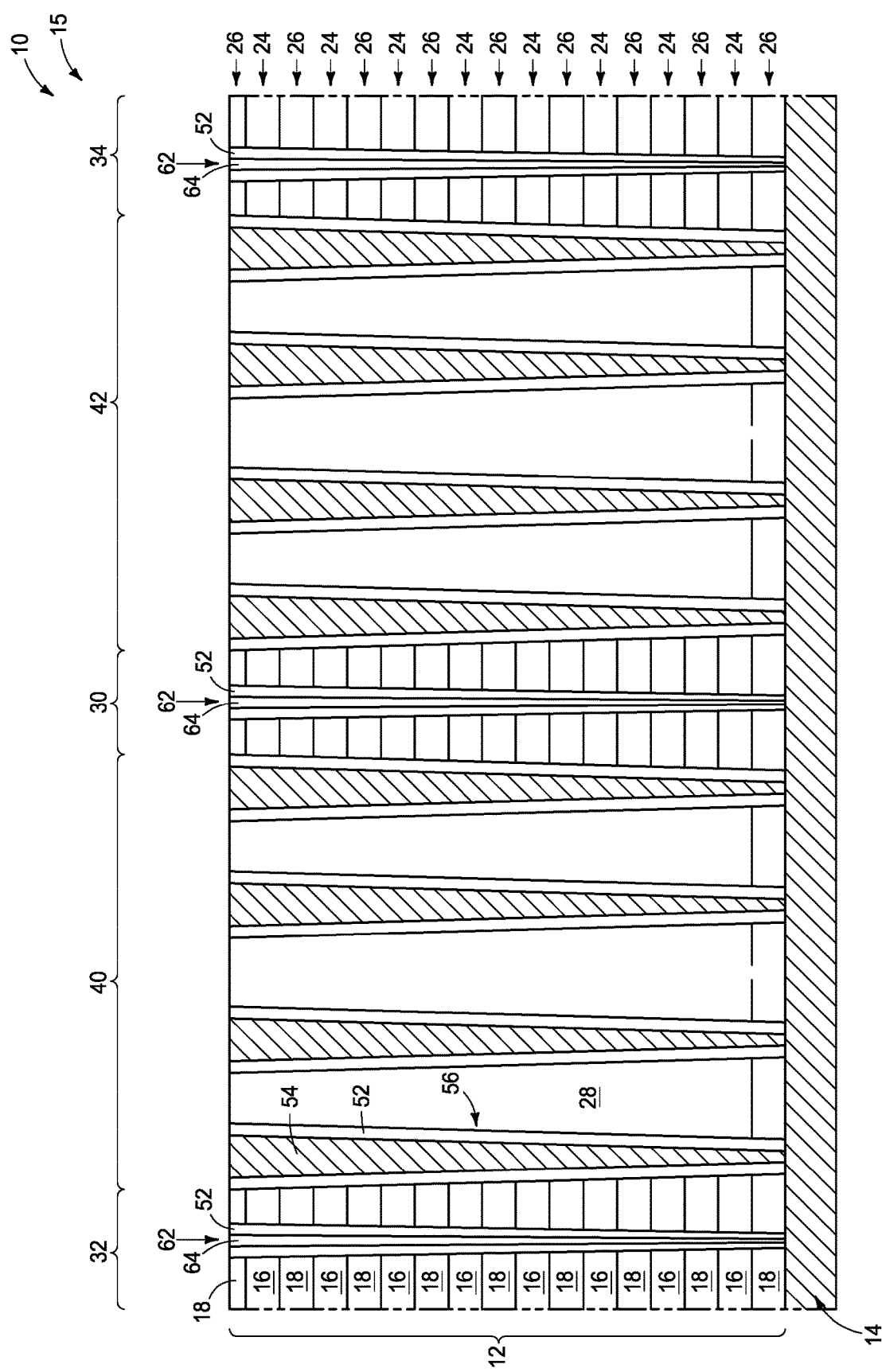

Referring to FIGS. 13 and 13A, insulative material 64 is formed within the trenches 62. The insulative material 64 may comprise any suitable composition(s); and in some embodiments may comprise, consist essentially of, or consist of one or more of silicon, silicon dioxide, carbon, high-k material (e.g., aluminum oxide), etc. The insulative material 64 may comprise doped silicon dioxide in some embodiments; with example doped silicon dioxides including borophosphosilicate glass, phosphosilicate glass, fluorosilicate glass, carbon-doped silicon dioxide, boron-doped silicon dioxide, etc.

In some embodiments, the insulative material 64 may be referred to as a second insulative material to distinguish it from the first insulative material 18 within the levels 26. In some embodiments, the insulative material 64 may be referred to as a third insulative material to distinguish it from the first and second insulative materials 18 and 52.

The materials 52 and 64 together form panels 66 within the slits 44, 46 and 48. The panels 66 may be referred to as first panels to distinguish them from other panels formed at subsequent process stages.

Notably, the blocks 40 and 42 remain symmetric at the process stage of FIGS. 13 and 13A.

Figure 13B:
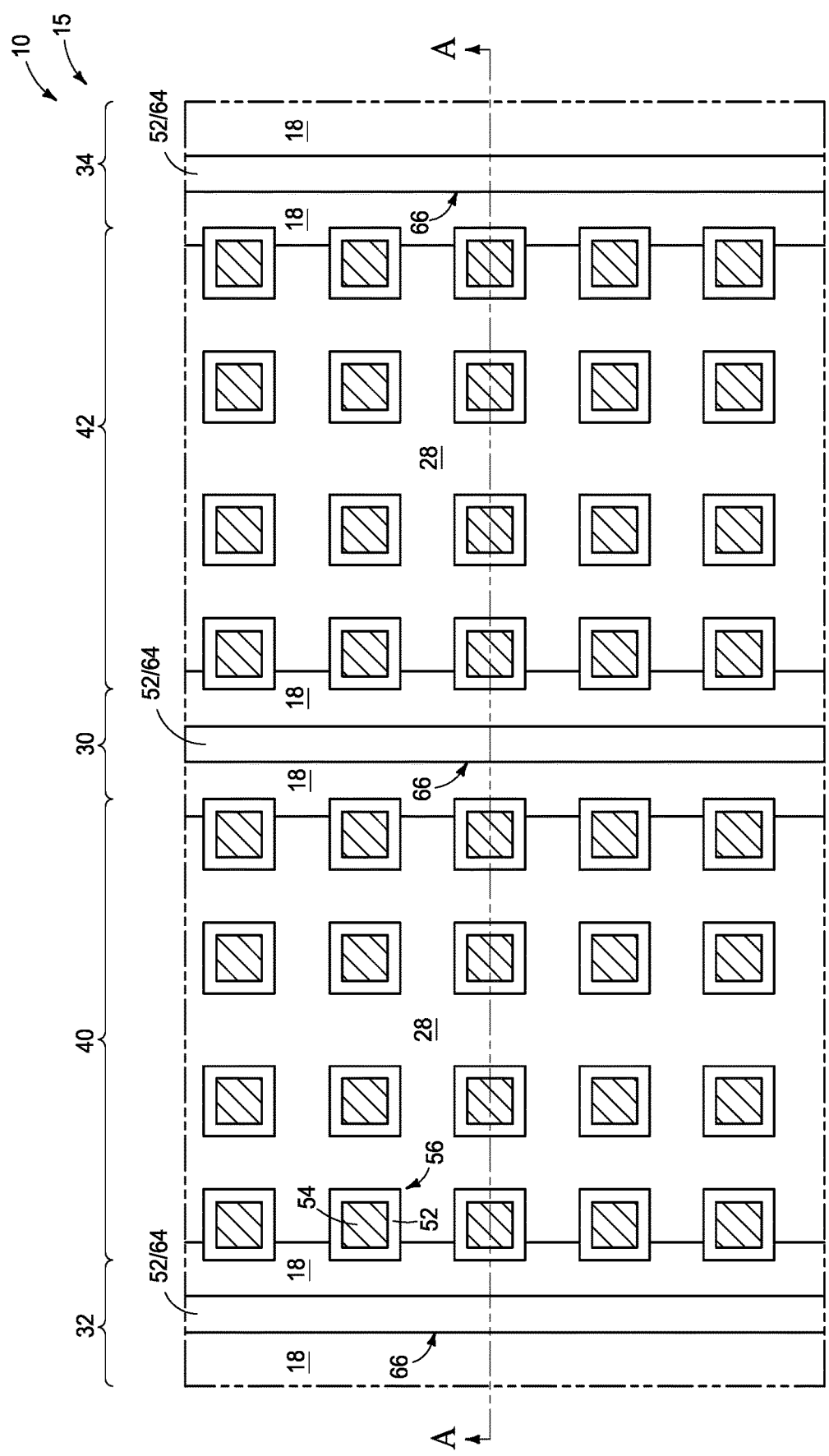
FIG. 13B is a top-down view similar to that of FIG. 13.

In some embodiments, the materials 52 and 64 may comprise a same composition as one another. FIG. 13B shows a configuration analogous to that of FIG. 13, but in which the materials 52 and 64 are the same composition as one another and merge to form a single composition labeled as 52/64. The configuration of FIG. 13B will be utilized for the remaining drawings of this disclosure to simplify the drawings.

Figure 14:
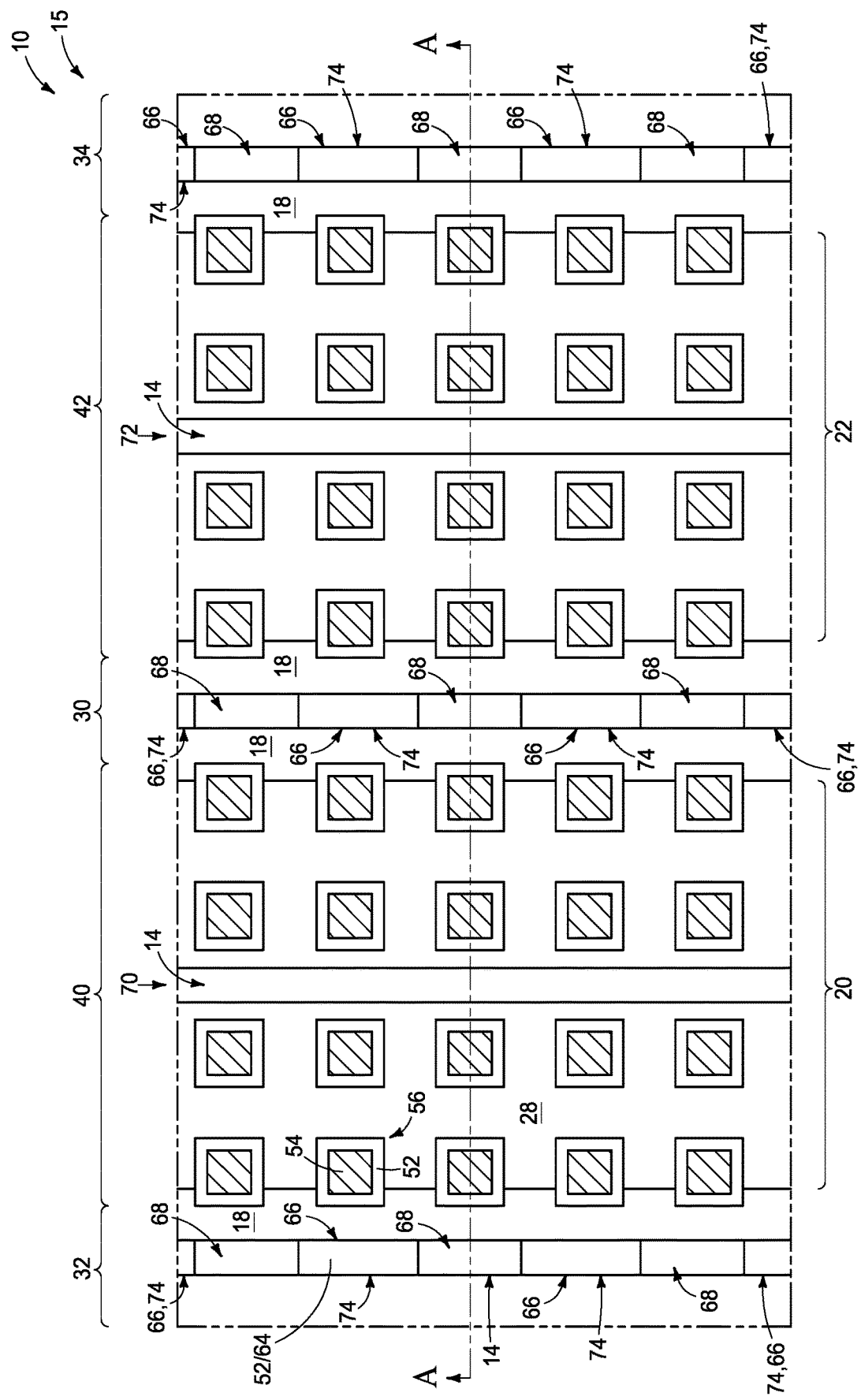
FIGS. 14 and 14A are views of the assembly of FIGS. 9, 9A and 9B at an example process stage following that of FIGS. 13 and 13A. The view of FIG. 14 is a diagrammatic top-down view. The view of FIG. 14A is a diagrammatic cross-sectional side view along the line A-A of FIG. 14.
Figure 14A:
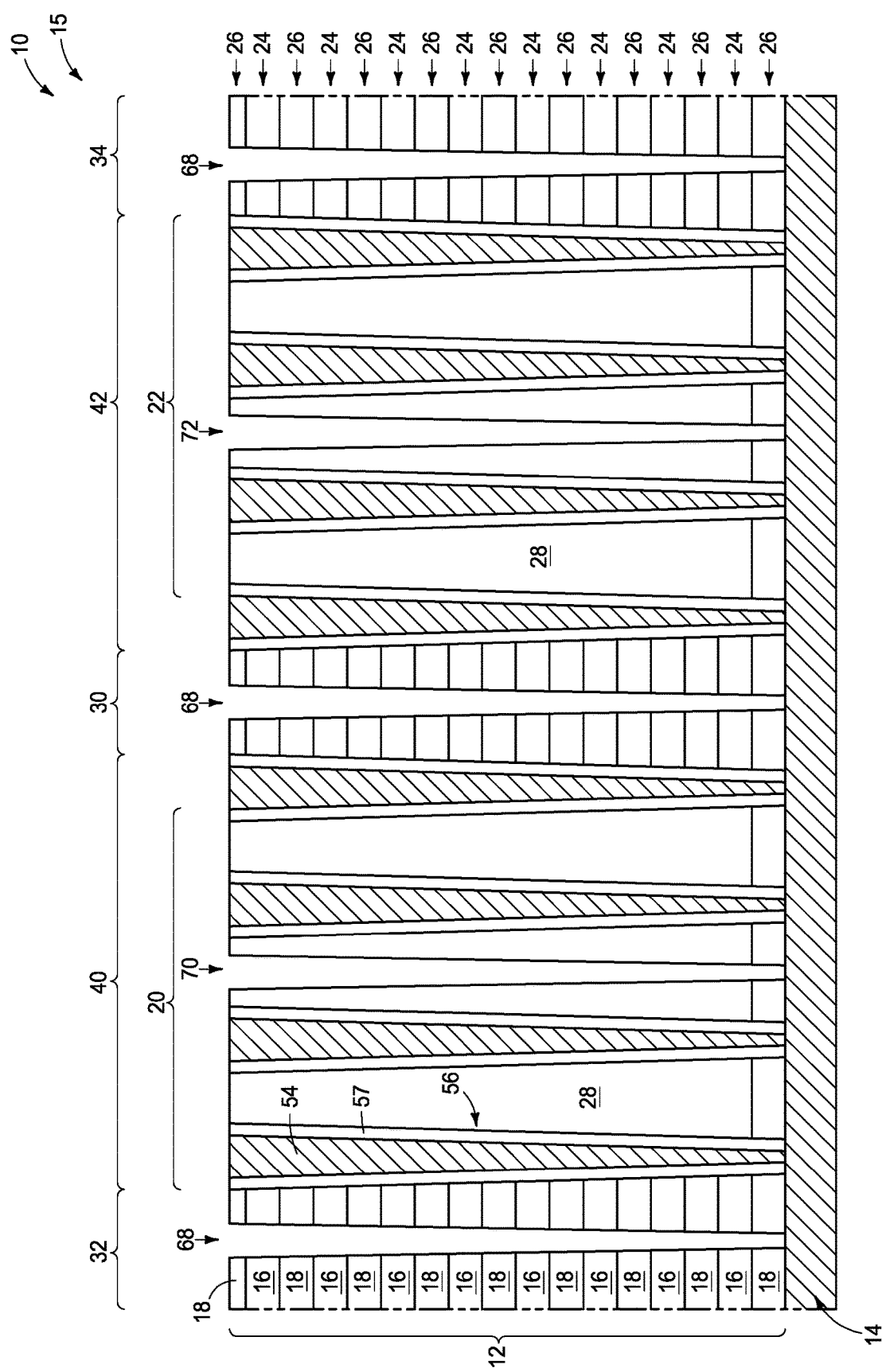

Referring to FIGS. 14 and 14A, openings 68 are formed to extend through the panels 66. The openings 68 may be referred to as second openings to distinguish them from the first openings 50 shown in FIGS. 10 and 10A. Also, slits 70 and 72 are formed to extend through the slabs 20 and 22, respectively. The openings 68 and slits 70, 72 may be formed with any suitable processing. For instance, a patterned mask may be provided over the assembly 10 and utilized to define locations of the openings 68 and the slits 70, 72; one or more etches may be utilized to form the openings and slits, and then the patterned mask may be removed to leave the illustrated assembly.

The slits 70 and 72 may be referred to as a fourth slit and a fifth slit, respectively, in some embodiments.

The openings 68 expose the sacrificial material 16 along the first levels 24 of the stack 12. The top-down view of FIG. 14 shows that remaining regions 74 of the first panels 66 remain between the openings 68, with such remaining regions being shown to comprise the material 52/64 described above with reference to FIG. 13B.

Notably, the blocks 40 and 42 are symmetric at the process stage of FIGS. 14 and 14A.

Figure 15:
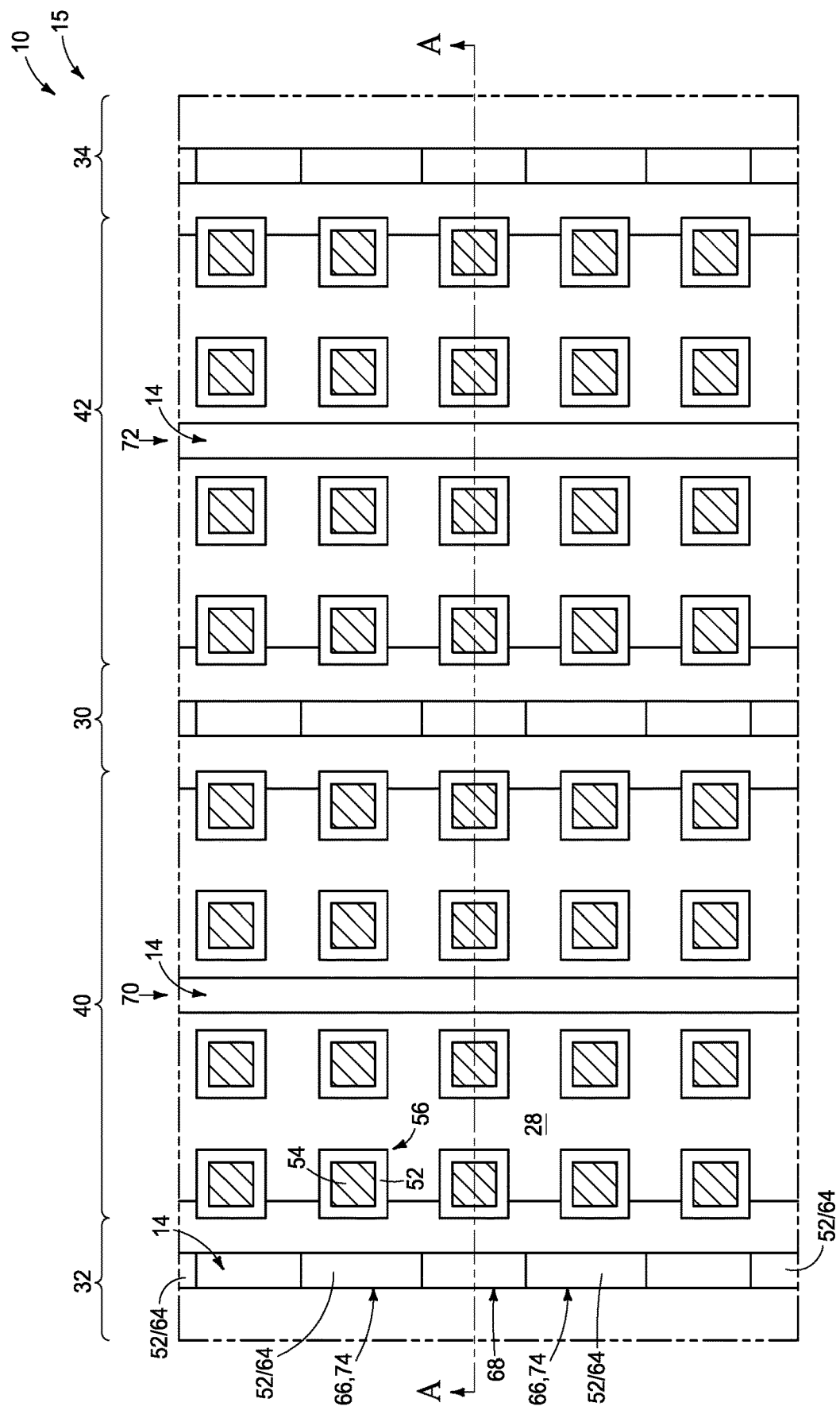
FIGS. 15 and 15A are views of the assembly of FIGS. 9, 9A and 9B at an example process stage following that of FIGS. 14 and 14A. The view of FIG. 15 is a diagrammatic top-down view. The view of FIG. 15A is a diagrammatic cross-sectional side view along the line A-A of FIG. 15.
Figure 15A:
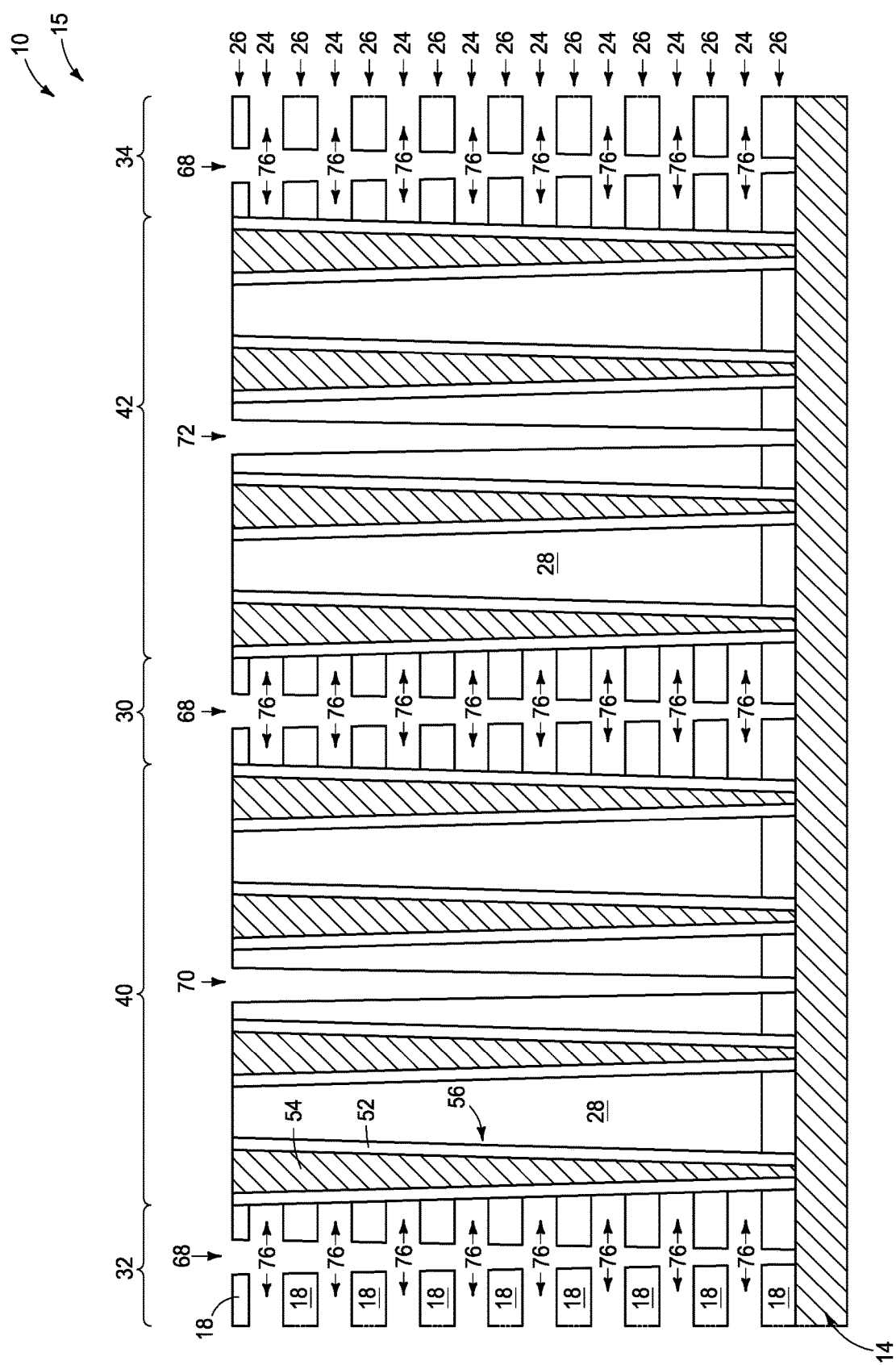

Referring to FIGS. 15 and 15A, the sacrificial material 16 (FIG. 14A) is removed to leave voids 76 along the first levels 24.

Figure 16:
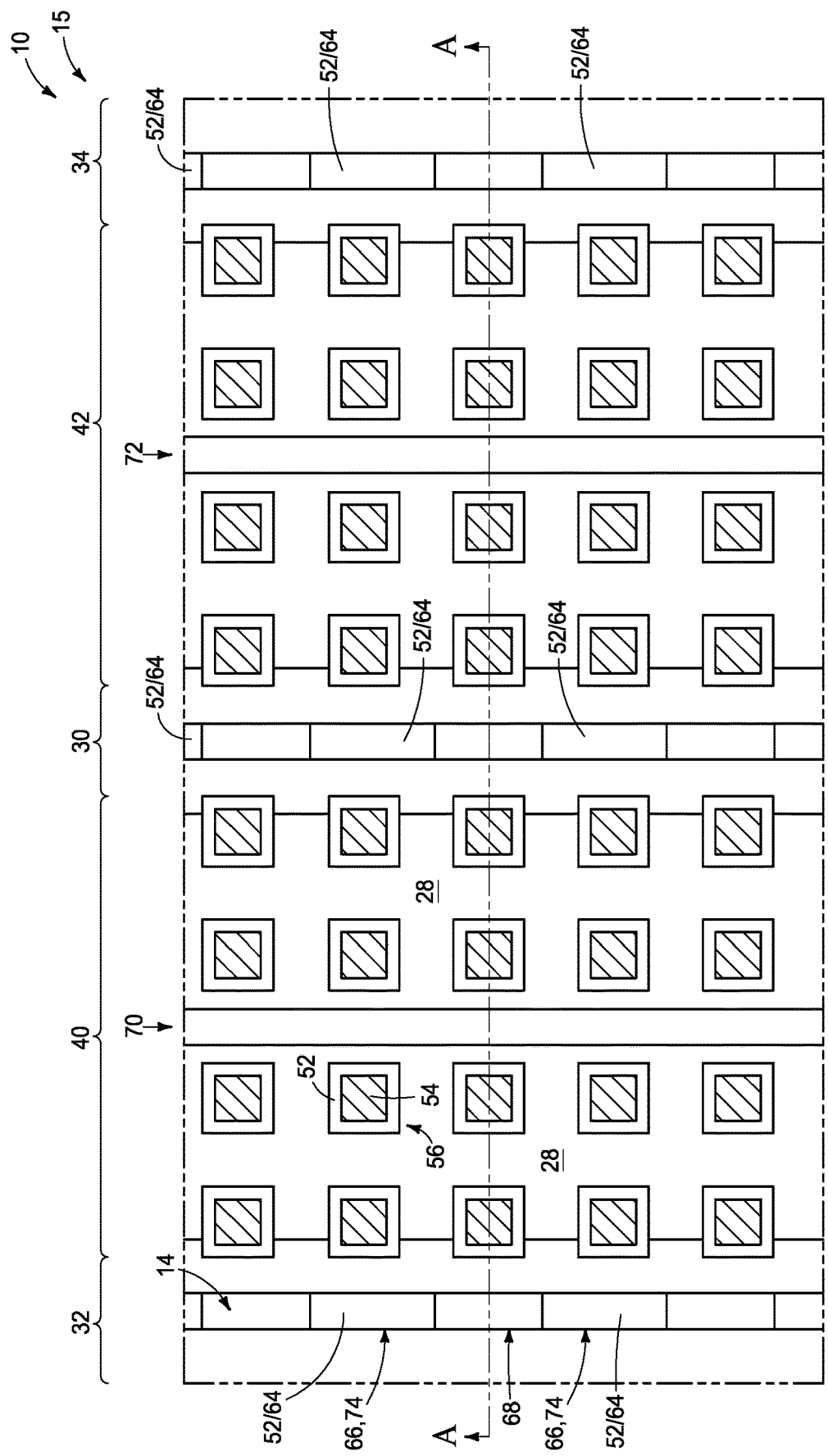
FIGS. 16, 16A and 16B are views of the assembly of FIGS. 9, 9A and 9B at an example process stage following that of FIGS. 15 and 15A. The view of FIG. 16 is a diagrammatic top-down view. The view of FIG. 16A is a diagrammatic cross-sectional side view along the line A-A of FIG. 16. The view of FIG. 16B is a diagrammatic cross-sectional side view along a cross-section analogous to that of prior art FIG. 8.
Figure 16A:
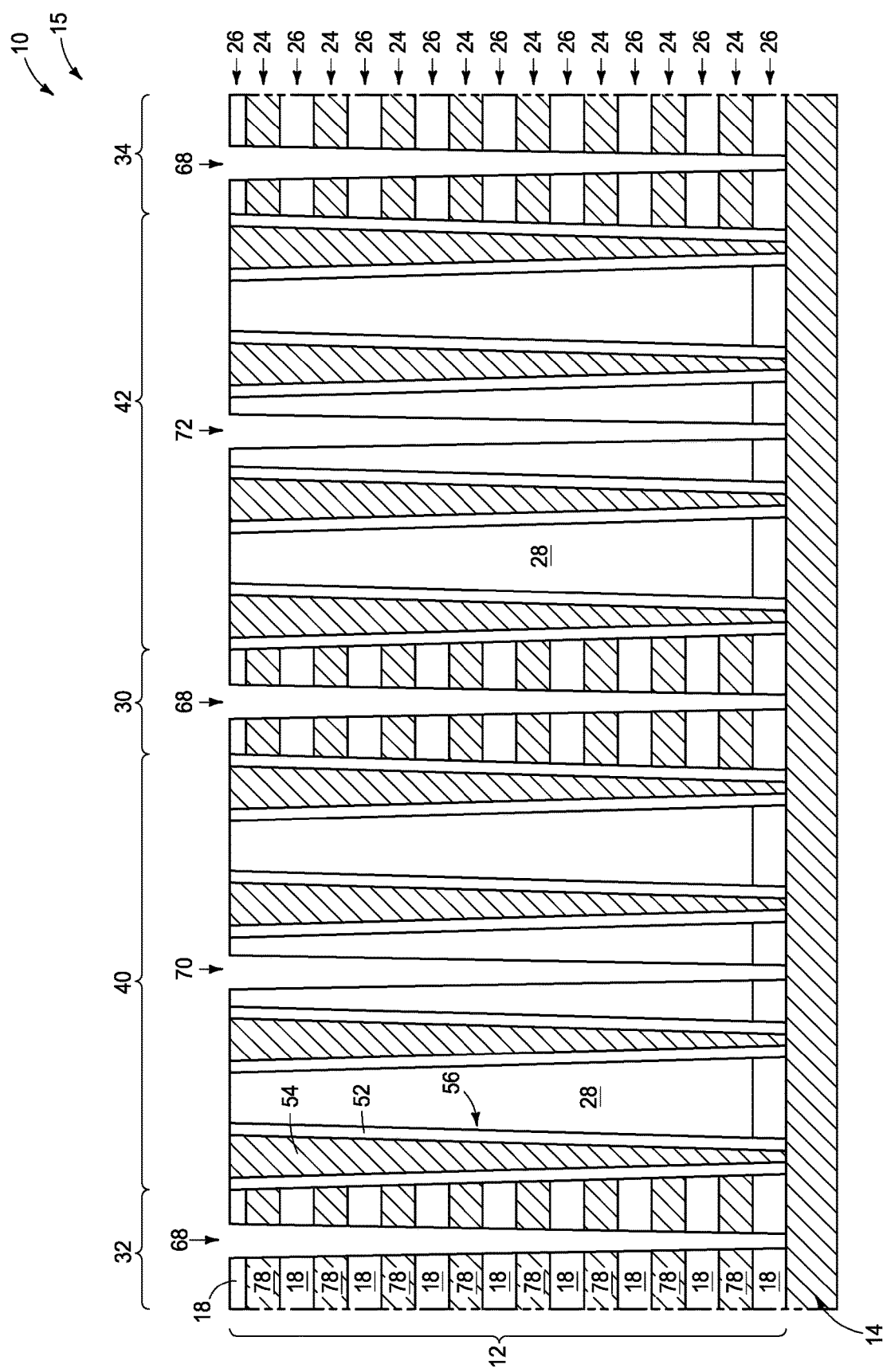

Referring to FIGS. 16 and 16A, conductive material 78 is formed within the voids 76 (FIG. 15A) of the first levels 24. The first levels 24 thus become conductive levels, and the stack 12 becomes a stack of alternating conductive levels 24 and insulative levels 26 analogous to the stack 622 described above with reference to FIG. 6. The conductive material 78 may comprise the same materials described above relative to the conductive material 628 of FIG. 6. Accordingly, in some embodiments the conductive material 78 may comprise a tungsten core, and a metal nitride liner extending at least partially around such tungsten core. The metal nitride liner may comprise, for example, one or both of tungsten nitride and titanium nitride. Also, in some embodiments a dielectric-barrier material may be provided within the voids 76 to line such voids prior to provision of the conductive materials 78 within the voids.

The formation of the voids 76 at the process stage of FIGS. 15 and 15A, followed by the filling of such voids with the conductive material 78, may be considered to be replacement of the sacrificial material 16 (FIG. 14A) with the conductive material 78. In some applications, the same replacement may be conducted across one or more memory arrays proximate the illustrated crest (intervening) location 15. Such memory arrays may include, for example, memory arrays analogous to the arrays 604 and 606 of FIG. 5. Accordingly, memory cells analogous to the memory cells 638 of FIG. 6 may be formed proximate the illustrated crest location 15 of FIGS. 16 and 16A.

Figure 16B:
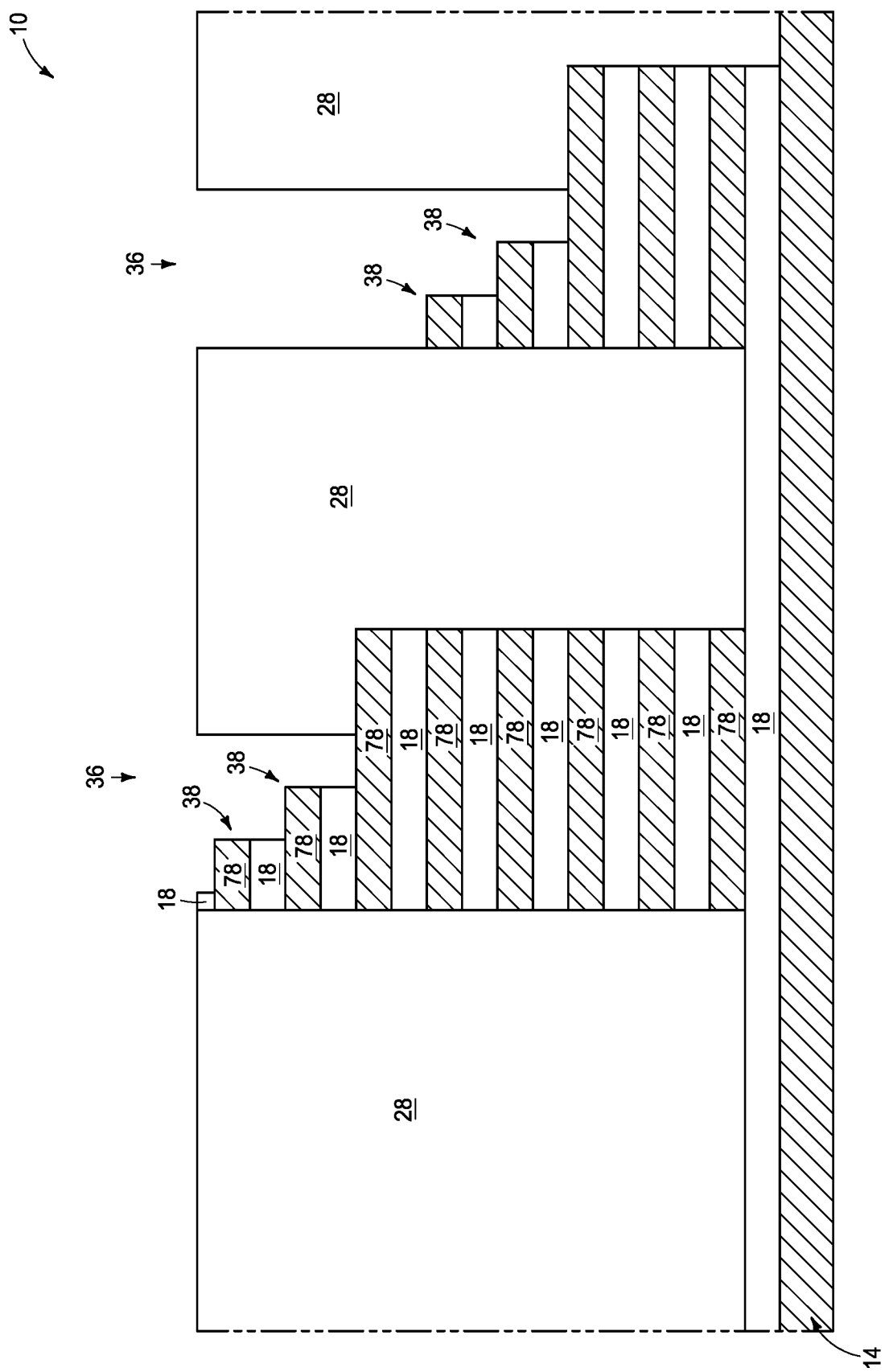

The replacement of the sacrificial material 16 with the conductive material 78 may also be conducted within interconnect regions 36 of the type described above with reference to FIG. 9. FIG. 16B shows the same region as is shown in FIG. 9B, and shows such region at the processing stage of FIGS. 16 and 16A (i.e., after the sacrificial material 16 of FIG. 9B is replaced with the conductive material 78 utilizing the processing of FIGS. 15 and 16). The resulting configuration of FIG. 16B is analogous to that described above with reference to FIG. 8.

Figure 17:
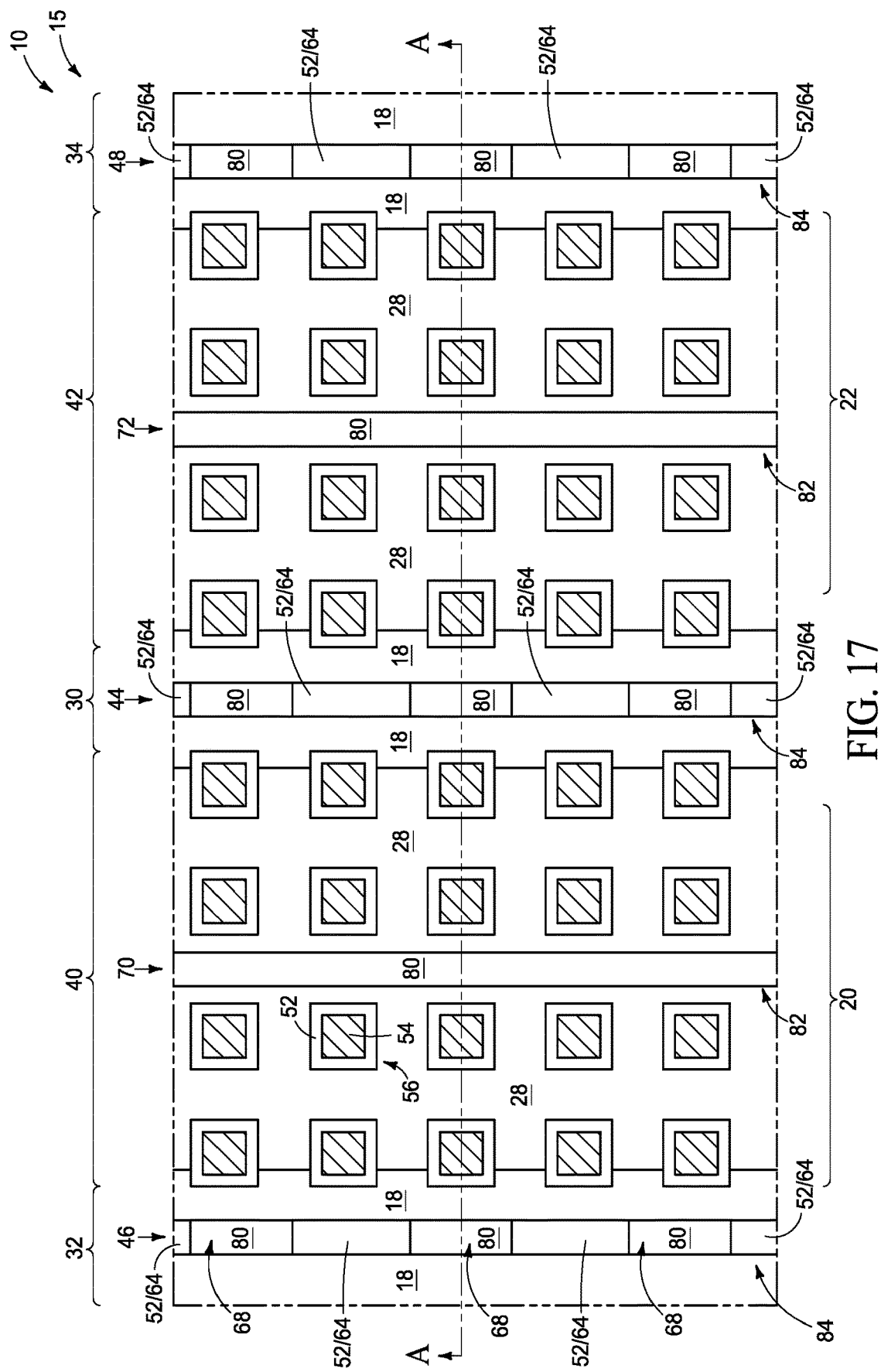
FIGS. 17 and 17A are views of the assembly of FIGS. 9, 9A and 9B at an example process stage following that of FIGS. 16, 16A and 16B. The view of FIG. 17 is a diagrammatic top-down view. The view of FIG. 17A is a diagrammatic cross-sectional side view along the line A-A of FIG. 17.
Figure 17A:
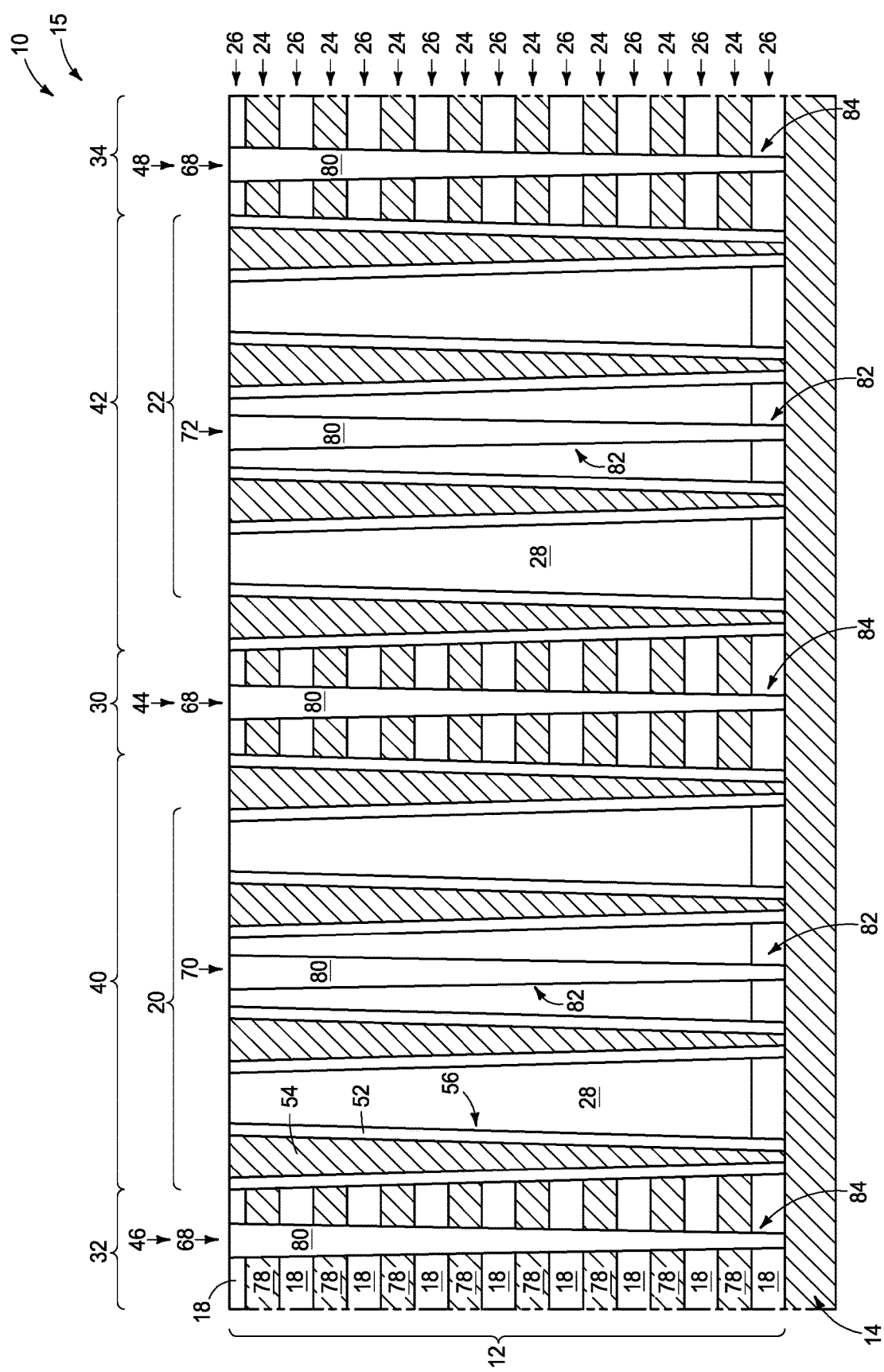

Referring to FIGS. 17 and 17A, the openings 68 and the slits 70, 72 may be filled with insulative material 80. The insulative material 80 forms panels 82 within the slits 70 and 74. The insulative material 80 together with the materials 52 and 64 forms panels 84 within the slits 44, 46 and 48. In some embodiments the slits 44, 46 and 48 may be considered to be a first series of slits, and the slits 70 and 72 may be considered to be a second series of slits which is formed subsequent to the first series of slits. The panels 80 and 84 may comprise different compositions relative to one another. Alternatively, the panels 80 and 84 may comprise the same composition as one another if the materials 52, 64 and 80 all comprise a same composition (e.g., all comprise, consist essentially of, or consist of silicon dioxide).

In some embodiments, at least one of the materials 52, 64 and 80 may be different relative to another of the materials 52, 64 and 80. For instance, one of the materials 52, 64 and 80 may comprise, consist essentially of, or consist of undoped silicon dioxide; and another may comprise, consist essentially of, or consist of carbon, doped silicon dioxide (e.g., carbon-doped silicon dioxide, borophosphosilicate glass, phosphosilicate glass, fluorosilicate glass, boron-doped silicon dioxide, etc.) and/or high-k oxide (e.g., aluminum oxide, hafnium oxide, zirconium oxide, etc.).

In some embodiments, the panels 66 (FIGS. 13-13B) may be considered to be first panels, the panels 82 may be considered to be second panels, and the panels 84 may be considered to be third panels; with the third panels comprising regions of the first panels.

The embodiment of FIGS. 17 and 17A comprises the support structures 56 extending through the slabs 20 and 22 of insulative material 28. In the illustrated embodiment, the support structures extend to an upper surface of the source structure 14 (e.g., may extend to conductively-doped silicon or tungsten silicide associate with the source structure 14). In other embodiments, the support structures 56 may extend to other depths; such as, for example, depths which do not reach the source structure 14, depths which penetrate into the source structure 14, etc.

Figure 1:
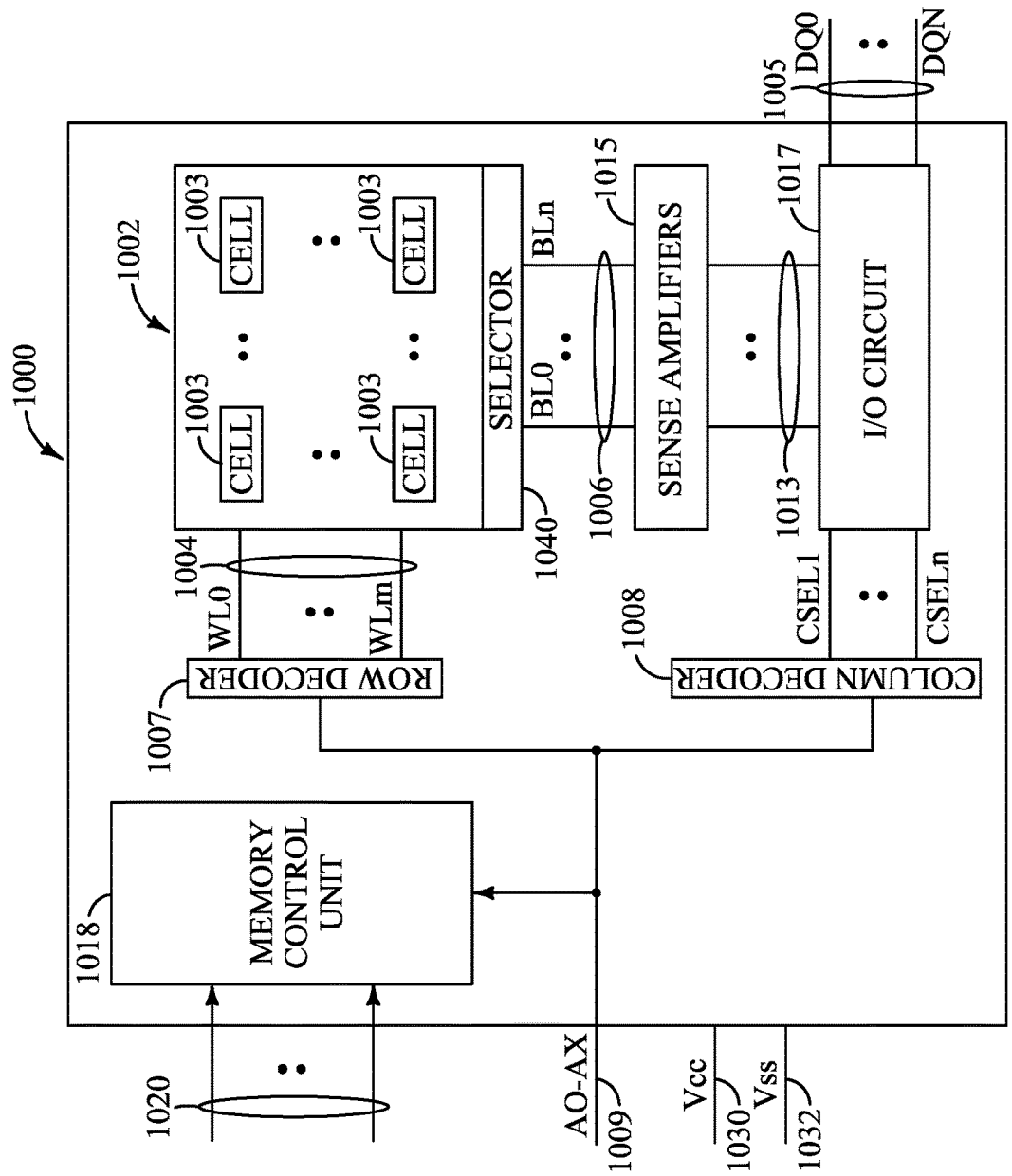
FIG. 1 shows a block diagram of a prior art memory device having a memory array with memory cells.
Figure 2:
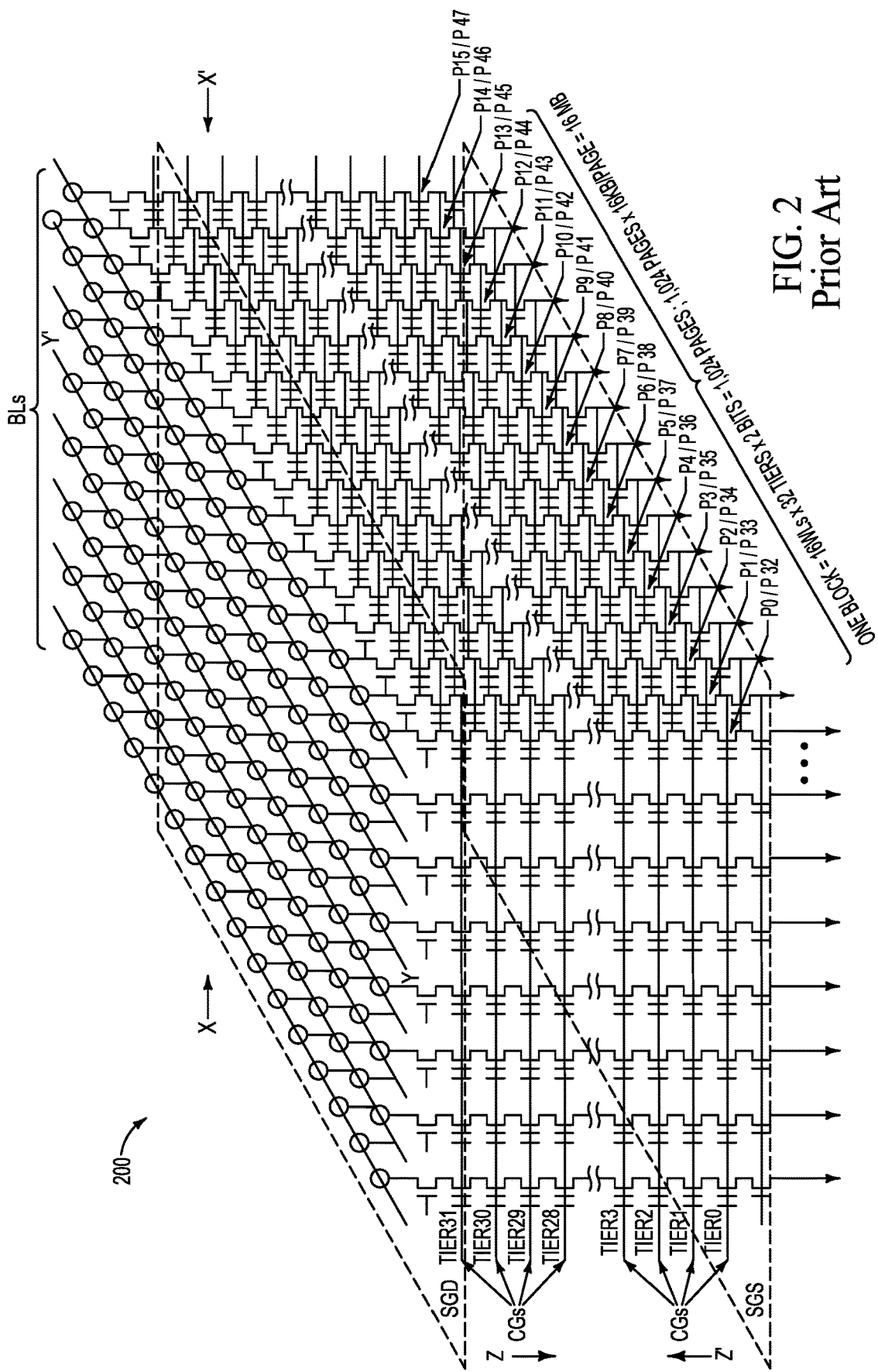
FIG. 2 shows a schematic diagram of the prior art memory device of FIG. 1 in the form of a 3D NAND memory device.
Figure 3:
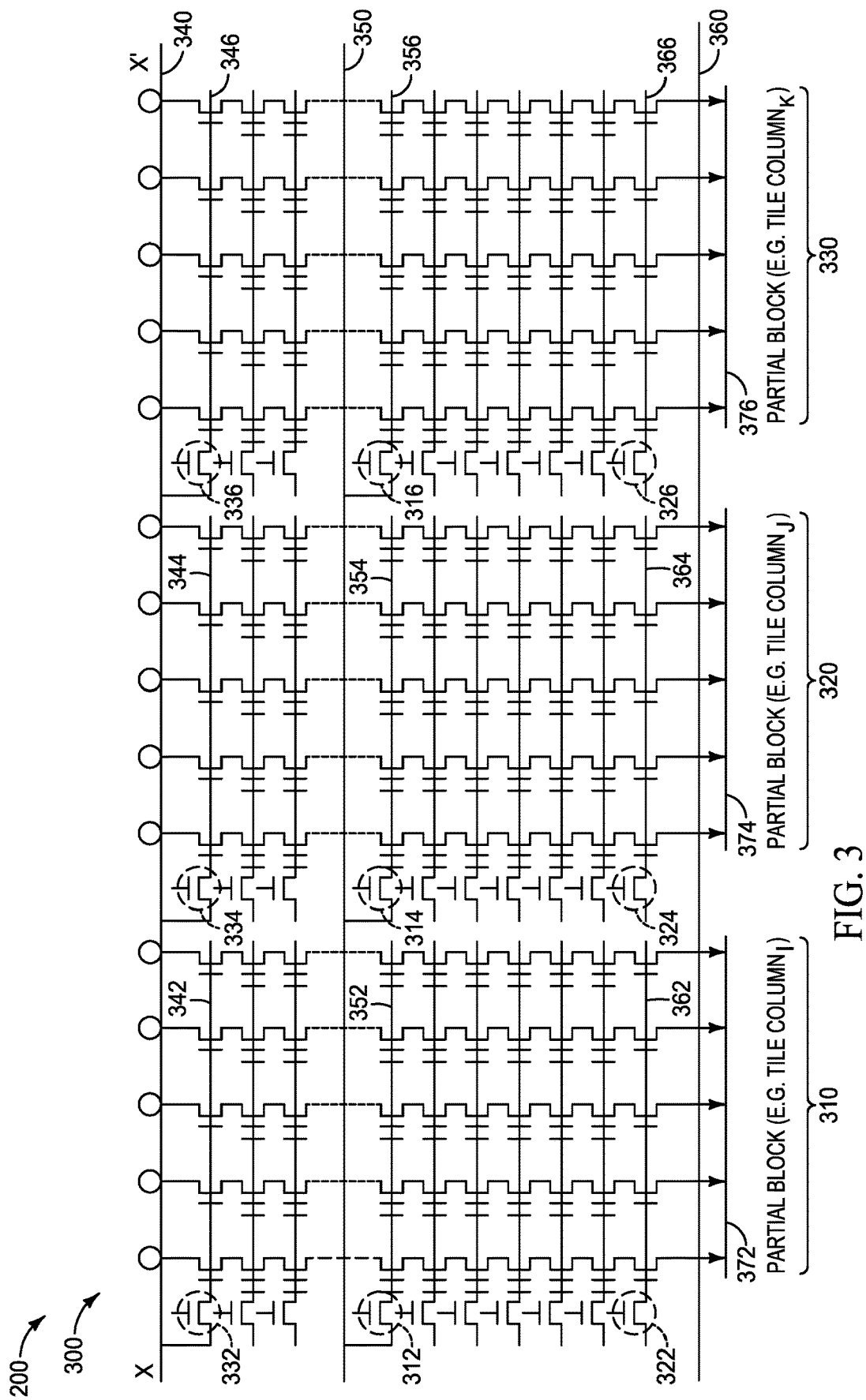
FIG. 3 shows a cross-sectional view of the prior art 3D NAND memory device of FIG. 2 in an X-X' direction.
Figure 4:
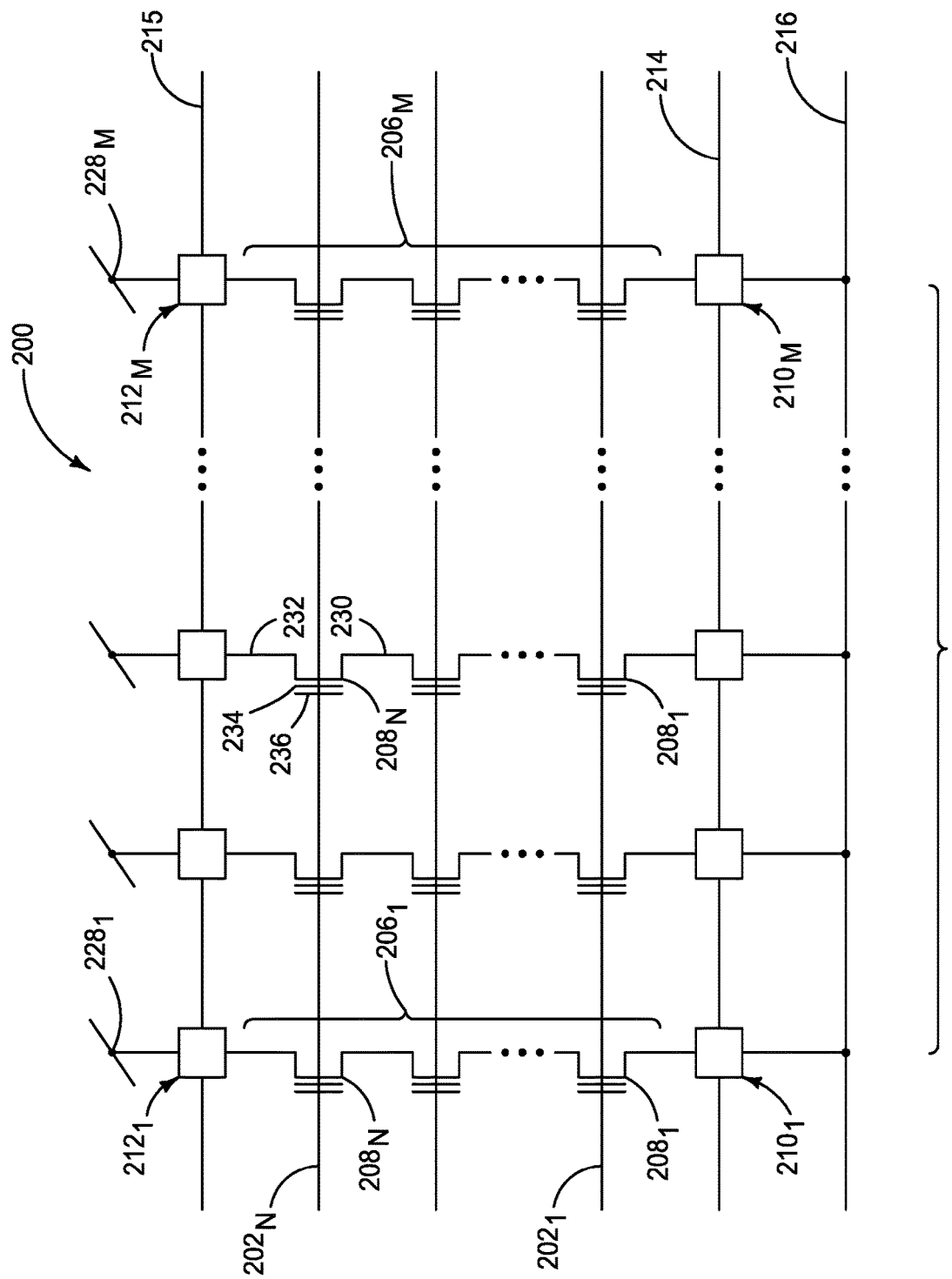
FIG. 4 is a schematic diagram of a prior art NAND memory array.
Figure 5:
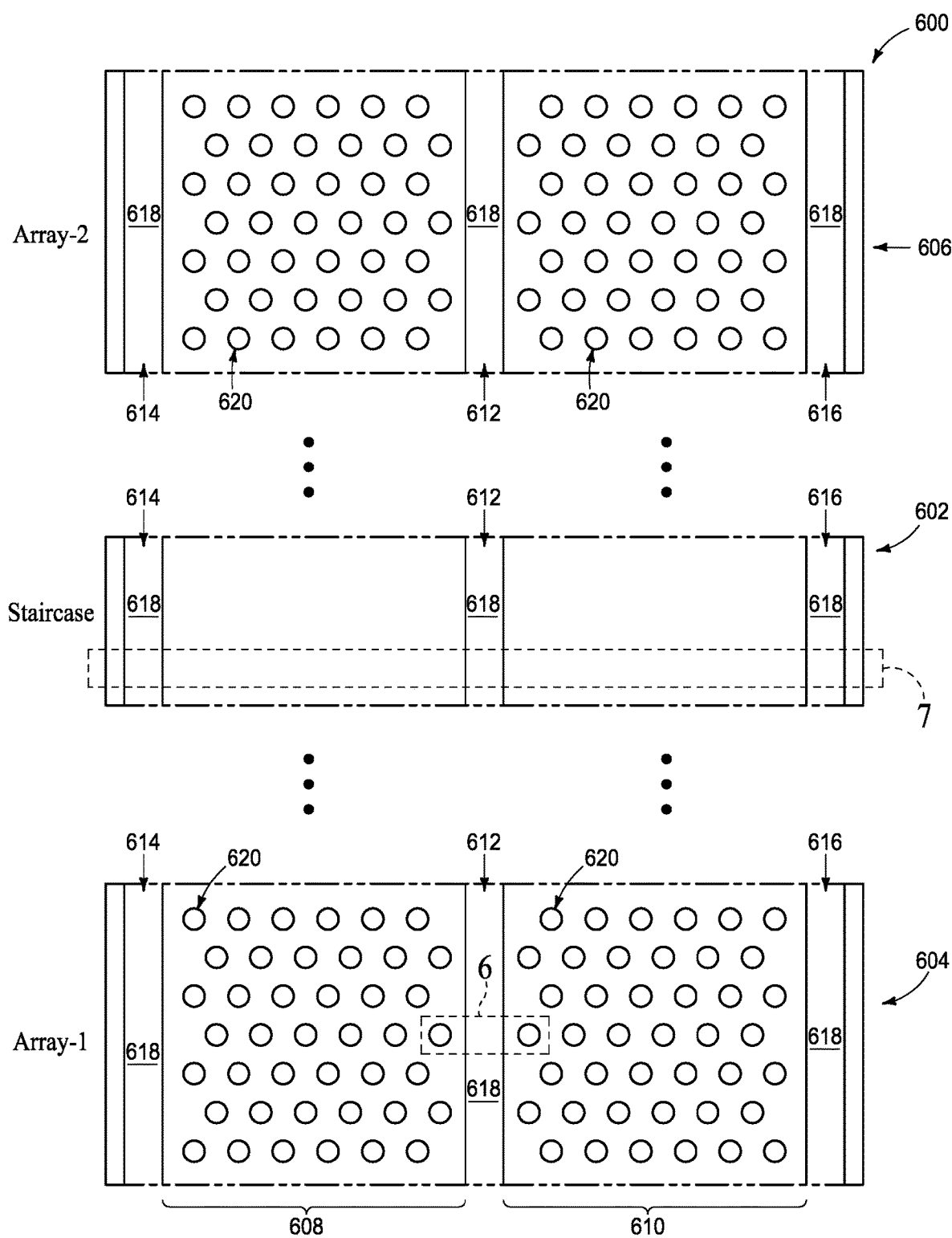
FIG. 5 is a diagrammatic top-down view of a prior art integrated assembly showing a staircase region laterally between memory array regions associated with a semiconductor die.

The intervening region (crest region) 15 of FIGS. 17 and 17A may be in an identical location as the region 645 of FIG. 7, and accordingly may be proximate a memory array region analogous to one of the memory array regions 604 and 606 of FIG. 5. Such memory array regions include channel material pillars 620 which extend through a stack (12 of FIG. 17A, 622 of FIG. 6; with the stacks 12 and 622 being identical to one another in some applications); with such stack including alternating conductive levels and insulative levels.

The intervening region 15 of FIGS. 17 and 17A may be between the memory array region (e.g., 604 of FIG. 5) and a staircase region (e.g., 36 of FIG. 16B, 646 of FIG. 8; with the regions 36 and 646 and identical to one another in some embodiments). The staircase region may comprise the staggered terminal ends 38 of the conductive levels as shown in FIG. 16B (with analogous staggered terminal ends 648 being shown in FIG. 8).

The first and second slabs 20 and 22 extend through the stack 12 of alternating conductive and insulative levels 24 and 26 of FIG. 17A, and are spaced apart from one another by the first bridging region 30. The second and third bridging regions 32 and 34 are on opposing sides of the slabs 20 and 22 relative to the first bridging region 30.

The first series of slits 44, 46 and 48 is along the bridging regions 30, 32 and 34, and extends in and out of the plane relative to the cross-section of FIG. 17A. The second series of slits 70 and 72 extends through the slabs 20 and 22, and is parallel to the slits 44, 46 and 48 of the first series. The panels 84 may be referred to as first panels within the slits 44, 46 and 48 of the first series; and the panels 82 may be referred to as second panels within the slits 70 and 72 of the second series. In some embodiments, the second panels 82 may be compositionally different from the first panels 84. For instance, the second panels 82 may comprise only the single insulative material 80, while the first panels 84 may comprise the material 80 in combination with one or more materials (52, 64) which may be compositionally different relative to the material 80.

In some embodiments, the material 80 may be referred to as a first material, and one of the materials 52, 64 may be referred to as a second material. In some embodiments, the first material 80 may comprise, consist essentially of, or consist of silicon dioxide, and the second material (52 or 64) may comprise one or more of doped silicon dioxide (e.g., phosphosilicate glass, borophosphosilicate glass, fluorosilicate glass, carbon-doped silicon dioxide, boron-doped silicon dioxide, etc.), carbon (e.g., amorphous carbon) and high-k dielectric material (e.g., aluminum oxide, hafnium oxide, zirconium oxide, etc.).

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a memory array region which includes channel material pillars extending through a stack of alternating conductive levels and insulative levels. A staircase region is offset from the memory array region and includes staggered terminal regions of the conductive levels. An intervening region is between the staircase region and the memory array region. The intervening region includes slabs of insulative material extending through the stack, and includes bridging regions laterally adjacent said slabs. Two spaced-apart slabs are along a cross-section. The spaced-apart slabs are a first slab and a second slab. A first bridging region is between the first and second slabs, a second bridging region is on an opposing side of the first slab from the first bridging region, and a third bridging region is on an opposing side of the second slab from the first bridging region. A first series of slits extends along the bridging regions and into a plane of the cross-section. The first series includes a first slit within the first bridging region, a second slit within the second bridging region and a third slit within the third bridging region. A second series of slits extends through the slabs, with the slits of the second series being parallel to the slits of the first series. The second series includes a fourth slit within the first slab and a fifth slit within the second slab. First panels are within the slits of the first series. Second panels are within the slits of the second series. The second panels are compositionally different from the first panels.

Some embodiments include a method of forming an integrated assembly. A construction is formed to include a stack of alternating first and second levels. The first levels comprise sacrificial material and the second levels comprise first insulative material. A pair of insulative slabs is formed to extend through a region of the construction. The insulative slabs are a first slab and a second slab. A first bridging region is between the first and second slabs, a second bridging region is on an opposing side of the first slab from the first bridging region, and a third bridging region is on an opposing side of the second slab from the first bridging region. A first series of slits is formed to extend along the bridging regions, and to extend through the stack. The first series includes a first slit within the first bridging region, a second slit within the second bridging region and a third slit within the third bridging region. First panels are formed within the slits of the first series. Openings are formed through the first panels. The openings extend through the stack to expose the sacrificial material of the first levels. Remaining regions of the first panels are adjacent to the openings. A second series of slits is formed to extend through the slabs. The second series includes a fourth slit within the first slab and a fifth slit within the second slab. After the openings and the second series of slits are formed, the sacrificial material of the first levels is removed to form voids. Conductive material is formed within the voids. Second insulative material is formed within the openings and within the slits of the second series. The second insulative material forms second panels within the slits of the second series. The second insulative material within the openings, together with the remaining regions of the first panels, form third panels within the slits of the first series.

Some embodiments include a method of forming an integrated assembly. A construction is formed to include a stack of alternating first and second levels. The first levels comprise sacrificial material and the second levels comprise first insulative material. The construction includes a memory array region and a staircase region offset from the memory array region. The staircase region comprises staggered terminal regions of the first levels. The construction includes an intervening region between the staircase region and the memory array region. A pair of insulative slabs are formed within the intervening region of the construction. The insulative slabs are a first slab and a second slab. A first bridging region being is between the first and second slabs, and comprises a first portion of the stack. A second bridging region is on an opposing side of the first slab from the first bridging region and comprises a second portion of the stack. A third bridging region is on an opposing side of the second slab from the first bridging region and comprises a third portion of the stack. First, second and third slits are formed to extend into the first, second and third portions of the stack, respectively. First openings are formed to extend through the slabs during the forming of the first, second and third slits. The first openings and the first, second and third slits are lined with liner material. Metal-containing conductive material is formed within the lined first openings and within the lined first, second and third slits. The metal-containing conductive material within the lined first, second and third slits is replaced with second insulative material. The second insulative material and the liner material together form first panels within the first, second and third slits. Second openings are formed through the first panels. The second openings expose the sacrificial material of the first levels. Remaining regions of the first panels are adjacent to the second openings. A fourth slit is formed within the first slab, and a fifth slit is formed within the second slab. The sacrificial material of the first levels is removed to form voids. Conductive material is formed within the voids. Third insulative material is formed within the second openings and within the fourth and fifth slits. The third insulative material forms second panels within the fourth and fifth slits. The third insulative material within the second openings, together with the remaining regions of the first panels, form third panels within the first, second and third slits.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly comprising:
a memory array region which includes channel material pillars extending through a stack of alternating conductive levels and insulative levels;
a staircase region offset from the memory array region and comprising staggered terminal regions of the conductive levels;
an intervening region between the staircase region and the memory array region, the intervening region being distinct from and non-overlapping the staircase region and the memory array region and comprising a plurality of regions of the stack of alternating conductive levels and insulative levels, the plurality of regions of the stack including a first region of the stack, a second region of the stack and a third region of the stack; the intervening region including slabs of insulative material extending through the stack, and including bridging regions laterally adjacent said slabs; two spaced-apart slabs being along a cross-section; the spaced-apart slabs being a first slab and a second slab; a first bridging region comprising the first region of the stack being between the first and second slabs, a second bridging region comprising the second region of the stack being on an opposing side of the first slab from the first bridging region, and a third bridging region comprising the third region of the stack being on an opposing side of the second slab from the first bridging region;
a first series of slits within the intervening region, each slit comprised by the first series of slits having a depth, a width and a length that exceeds the width with each slit extending lengthwise along the bridging regions and into a plane of the cross-section; the first series including a first slit within the first bridging region, a second slit within the second bridging region and a third slit within the third bridging region;
a second series of slits extending through the slabs, with the slits of the second series being parallel to the slits of the first series; the second series including a fourth slit within the first slab and a fifth slit within the second slab;
first panels within the slits of the first series; and
second panels within the slits of the second series; the second panels being compositionally different from the first panels.

2. The integrated assembly of claim 1 wherein the second panels comprise only a single insulative material, and wherein the first panels comprise two or more insulative materials.

3. The integrated assembly of claim 2 wherein the two or more insulative materials of the first panels include a first insulative material and a second insulative material; and wherein the single insulative material of the first panels is the first insulative material.

4. The integrated assembly of claim 3 wherein the first insulative material comprises silicon dioxide.

5. The integrated assembly of claim 4 wherein the second insulative material comprises doped silicon dioxide.

6. The integrated assembly of claim 4 wherein the second insulative material comprises carbon.

7. The integrated assembly of claim 4 wherein the second insulative material comprises high-k dielectric material.

8. The integrated assembly of claim 4 wherein the second insulative material comprises aluminum oxide.

9. The integrated assembly of claim 1 comprising support pillars extending through the slabs.

10. The integrated assembly of claim 9 wherein the support pillars comprise metal.

11. The integrated assembly of claim 10 wherein the metal is laterally surrounded by a same composition present in the first panels.

12. The integrated assembly of claim 11 wherein said same composition comprises silicon dioxide.

13. The integrated assembly of claim 12 wherein said same composition is also present in the second panels.

14. The integrated assembly of claim 1 wherein the first slab is within a first block region, and wherein the second slab is within a second block region.

\* \* \* \* \*